(12) United States Patent
Chuang et al.

(10) Patent No.: US 12,381,158 B2
(45) Date of Patent: *Aug. 5, 2025

(54) WAFER BONDING METHOD AND BONDED DEVICE STRUCTURE

(71) Applicant: Taiwan Semiconductor Manufacturing Co., Ltd., Hsinchu (TW)

(72) Inventors: Harry-Haklay Chuang, Zhubei (TW); Yuan-Jen Lee, Hsinchu (TW); Nuo Xu, San Jose, CA (US); Fang-Lan Chu, Taichung (TW); Wei Cheng Wu, Zhubei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 398 days.

This patent is subject to a terminal disclaimer.

(21) Appl. No.: 17/748,640

(22) Filed: May 19, 2022

(65) Prior Publication Data
US 2023/0299010 A1 Sep. 21, 2023

Related U.S. Application Data

(60) Provisional application No. 63/321,230, filed on Mar. 18, 2022.

(51) Int. Cl.
*H01L 23/544* (2006.01)
*H01L 23/00* (2006.01)
*H01L 25/065* (2023.01)

(52) U.S. Cl.
CPC ............ *H01L 23/544* (2013.01); *H01L 24/08* (2013.01); *H01L 24/80* (2013.01);
(Continued)

(58) Field of Classification Search
None
See application file for complete search history.

(56) References Cited

U.S. PATENT DOCUMENTS 8,355,139 B2   1/2013   Shim
9,012,265 B2   4/2015   Yi et al.
(Continued)

FOREIGN PATENT DOCUMENTS

CN   104282608 A   1/2015
KR   20050069938 A   7/2005
(Continued)

OTHER PUBLICATIONS

U.S. Appl. No. 17/748,547, filed May 19, 2022.*

*Primary Examiner* — Asok K Sarkar
(74) *Attorney, Agent, or Firm* — Slater Matsil, LLP

(57) ABSTRACT

In an embodiment, a method includes: receiving a first wafer and a second wafer, the first wafer including a first alignment mark, the first alignment mark including a first grid of first magnetic features, the second wafer including a second alignment mark, the second alignment mark including a second grid of second magnetic features; aligning the first alignment mark with the second alignment mark in an optical alignment process; after the optical alignment process, aligning the first alignment mark with the second alignment mark in a magnetic alignment process, north poles of the first magnetic features being aligned with south poles of the second magnetic features, south poles of the first magnetic features being aligned with north poles of the second magnetic features; and forming bonds between the first wafer and the second wafer.

20 Claims, 21 Drawing Sheets

(52) U.S. Cl.
CPC .............. *H01L 25/0657* (2013.01); *H01L 2223/54426* (2013.01); *H01L 2224/0213* (2013.01); *H01L 2224/08147* (2013.01); *H01L 2224/8013* (2013.01); *H01L 2224/80895* (2013.01); *H01L 2224/80896* (2013.01); *H01L 2224/80948* (2013.01); *H01L 2225/06524* (2013.01); *H01L 2225/06593* (2013.01); *H01L 2924/3511* (2013.01)

(56) References Cited

U.S. PATENT DOCUMENTS

| | | | |
|---|---|---|---|
| 9,070,729 | B2 | 6/2015 | Ji et al. |
| 9,548,290 | B2 | 1/2017 | Wakiyama et al. |
| 2013/0252375 | A1 | 9/2013 | Yi et al. |
| 2022/0223483 | A1 | 7/2022 | Chaji |

FOREIGN PATENT DOCUMENTS

| | | |
|---|---|---|
| KR | 20150037146 A | 4/2015 |
| KR | 101573463 B1 | 12/2015 |
| KR | 20190054039 A | 5/2019 |
| TW | 202111721 A | 3/2021 |
| WO | 2005122706 A2 | 12/2005 |
| WO | 2021179270 A1 | 9/2021 |

\* cited by examiner

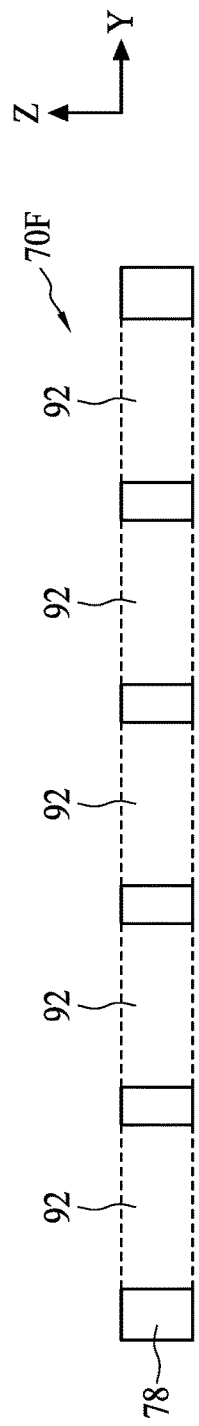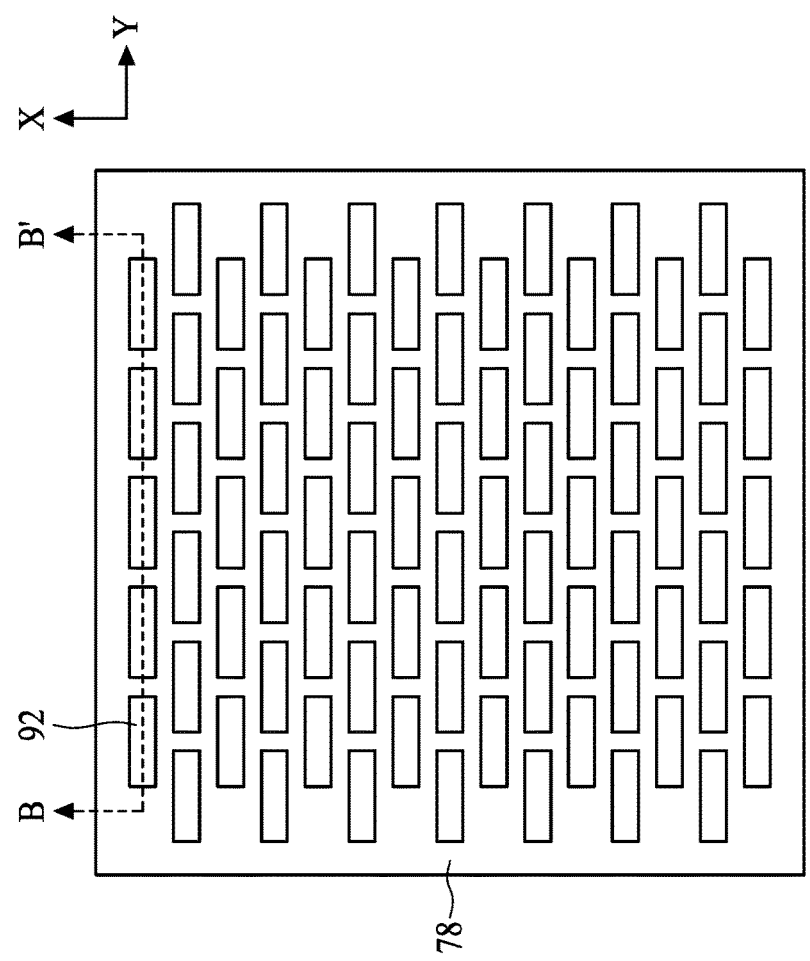

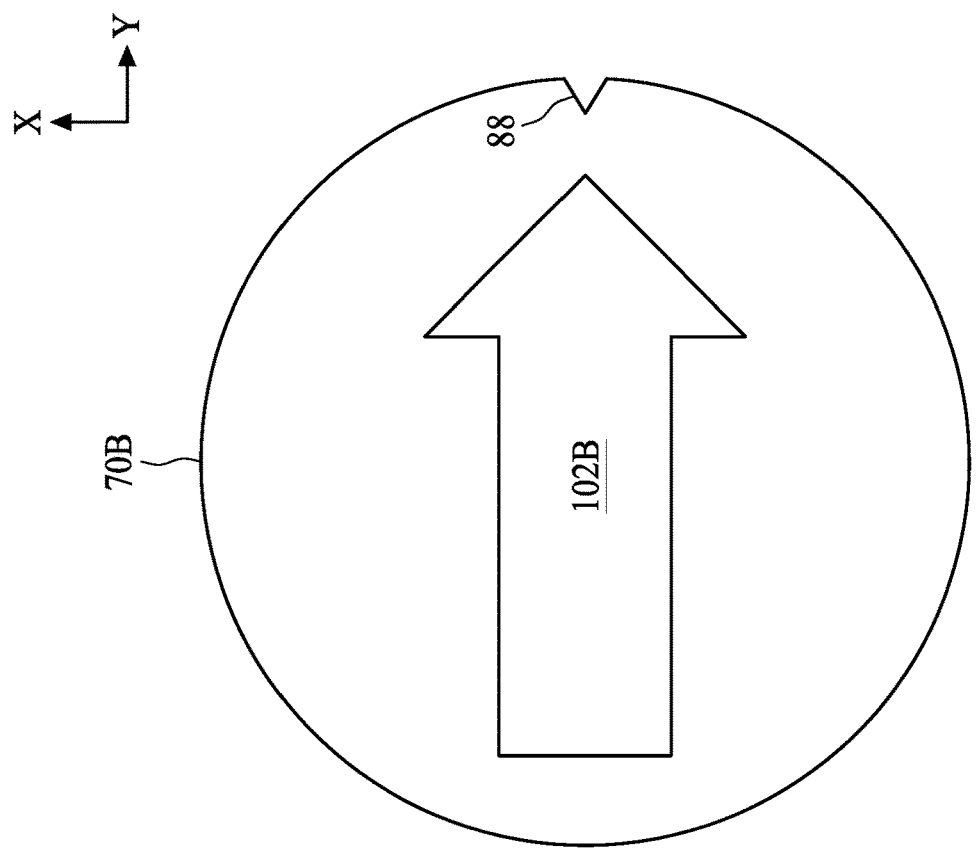
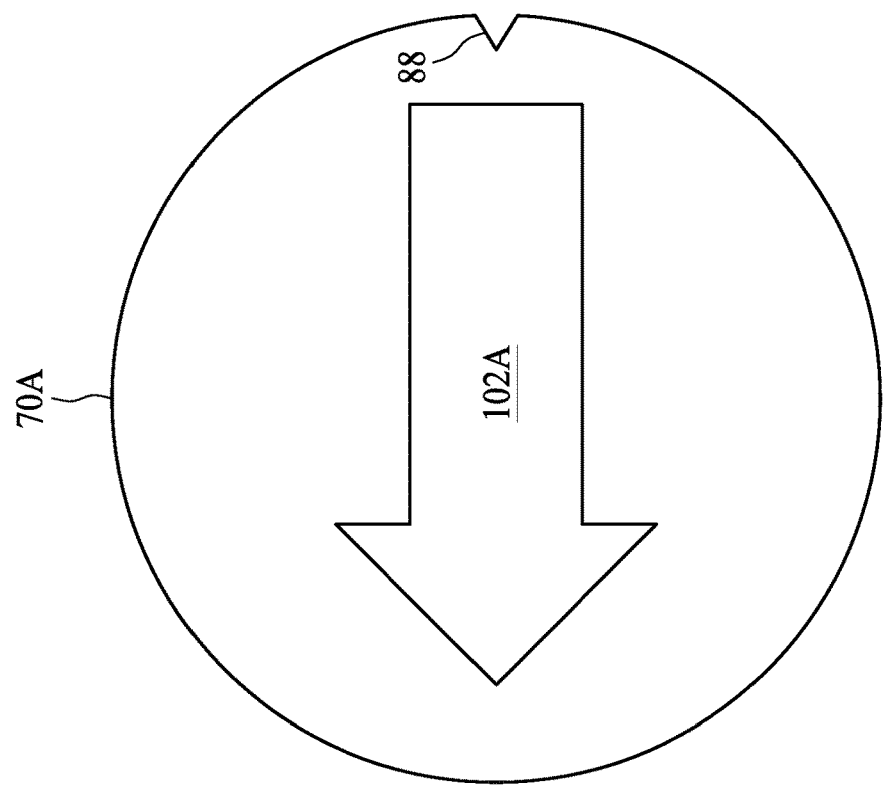
Figure 6

WAFER BONDING METHOD AND BONDED DEVICE STRUCTURE

PRIORITY CLAIM AND CROSS-REFERENCE

This application claims the benefit of U.S. Provisional Application No. 63/321,230, filed on Mar. 18, 2022, which application is hereby incorporated herein by reference.

BACKGROUND

Since the development of the integrated circuit (IC), the semiconductor industry has experienced continued rapid growth due to continuous improvements in the integration density of various electronic components (e.g., transistors, diodes, resistors, capacitors, etc.). For the most part, these improvements in integration density have come from repeated reductions in minimum feature size, which allows more components to be integrated into a given area. As the demand for miniaturization, higher speed, greater bandwidth, and lower power consumption and latency has grown, there has grown a need for smaller and more creative techniques for packaging semiconductor dies.

Stacked semiconductor devices have emerged as an effective technique for further reducing the physical size of a semiconductor device. In a stacked semiconductor device, active circuits such as logic and memory circuits are fabricated on different semiconductor wafers. Two or more semiconductor wafers may be bonded together through suitable bonding techniques to further reduce the form factor of the semiconductor device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A-4B are views of intermediate steps during a process for forming an alignment mark for a wafer, in accordance with some embodiments.

FIGS. 6-18 are various views of intermediate steps during a wafer bonding method, in accordance with some embodiments.

DETAILED DESCRIPTION

Figure 1:
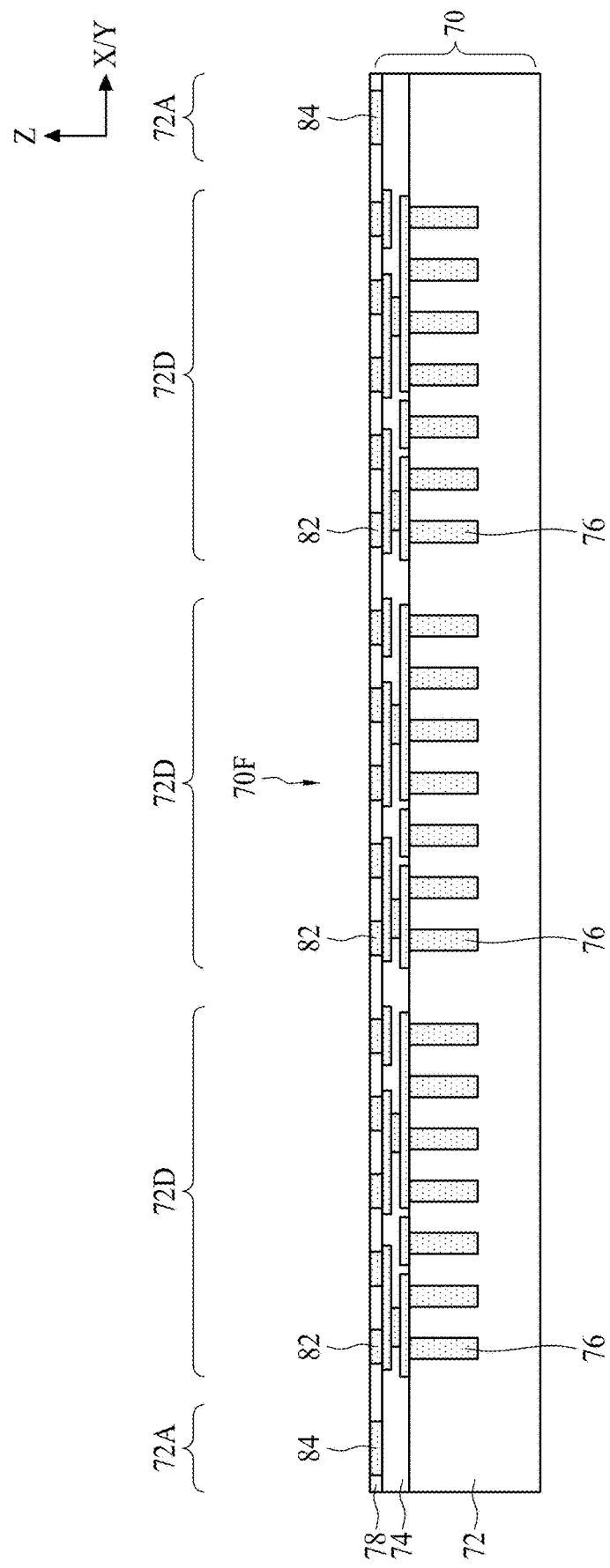
FIG. 1 is a cross-sectional view of a wafer, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to various embodiments, magnetic alignment marks are formed in wafers, and are utilized in an alignment process during bonding of the wafers. Specifically, two wafers may be formed with alignment marks that have opposite magnetic polarity. As a result, the alignment marks of the wafers are magnetically attracted to one another when the wafers are bonded together. The wafers may thus be magnetically self-aligned during bonding, which may reduce misalignment between the bonded wafers.

FIG. 1 is a cross-sectional view of a wafer 70, in accordance with some embodiments. Two wafers 70 will be bonded in subsequent processing to form a bonded wafer structure. The wafer 70 includes a semiconductor substrate 72, an interconnect structure 74, conductive vias 76, a dielectric layer 78, bonding pads 82, and alignment marks 84.

The wafer 70 has multiple device regions 72D, which each include features for a semiconductor die. The semiconductor dies may be integrated circuits dies, interposers, or the like. Each integrated circuit die may be a logic device (e.g., central processing unit (CPU), graphics processing unit (GPU), microcontroller, etc.), a memory device (e.g., dynamic random access memory (DRAM) die, static random access memory (SRAM) die, etc.), a power management device (e.g., power management integrated circuit (PMIC) die), a radio frequency (RF) device, a sensor device (e.g., image sensor die), a micro-electro-mechanical-system (MEMS) device, a signal processing device (e.g., digital signal processing (DSP) die), a front-end device (e.g., analog front-end (AFE) dies), the like, or combinations thereof (e.g., a system-on-a-chip (SoC) die).

In the illustrated embodiment, the wafer 70 additionally has multiple alignment mark regions 72A, and one or more of the alignment marks 84 are in each of the alignment mark regions 72A. The alignment mark regions 72A (including the alignment marks 84) may be disposed at the edges of the wafer 70, such that they are around the device regions 72D (including the bonding pads 82). In another embodiment, the alignment marks 84 are in the device regions 72D, and the wafer 70 does not have separate regions for the alignment marks 84.

The semiconductor substrate 72 may be a silicon substrate, doped or undoped, or an active layer of a semiconductor-on-insulator (SOI) substrate. The semiconductor substrate 72 may include other semiconductor materials, such as germanium; a compound semiconductor including silicon carbide, gallium arsenic, gallium phosphide, indium phosphide, indium arsenide, and/or indium antimonide; an alloy semiconductor including silicon germanium, gallium arsenide phosphide, aluminum indium arsenide, aluminum gallium arsenide, gallium indium arsenide, gallium indium phosphide, and/or gallium indium arsenide phosphide; or combinations thereof. Other substrates, such as multi-layered or gradient substrates, may also be used. The semiconductor substrate 72 has an active surface (e.g., the surface facing upwards in FIG. 1), sometimes called a front side, and an inactive surface (e.g., the surface facing downwards in FIG. 1), sometimes called a back side.

Devices (not separately illustrated) may be formed at the active surface of the semiconductor substrate 72. The devices may be active devices (e.g., transistors, diodes, etc.) and/or passive devices (e.g., capacitors, resistors, etc.). An interconnect structure 74 is over the active surface of the semiconductor substrate 72. The interconnect structure 74 interconnects the devices to form an integrated circuit. The interconnect structure may be formed of, for example, metallization patterns in dielectric layers, and may be formed by a damascene process, such as a single damascene process, a dual damascene process, or the like. The metallization patterns include metal lines and vias formed in one or more dielectric layers. The metallization patterns of the interconnect structure 74 are electrically coupled to the devices.

The conductive vias 76 extend into the interconnect structure 74 and/or the semiconductor substrate 72. The conductive vias 76 are electrically coupled to metallization patterns of the interconnect structure 74. The conductive vias 76 may be through-substrate vias, such as through-silicon vias. As an example to form the conductive vias 76, recesses can be formed in the interconnect structure 74 and/or the semiconductor substrate 72 by, for example, etching, milling, laser techniques, a combination thereof, or the like. A thin barrier layer may be conformally deposited in the recesses, such as by chemical vapor deposition (CVD), atomic layer deposition (ALD), physical vapor deposition (PVD), thermal oxidation, a combination thereof, or the like. The barrier layer may be formed from an oxide, a nitride, a carbide, combinations thereof, or the like. A conductive material may be deposited over the barrier layer and in the recesses. The conductive material may be formed by an electro-chemical plating process, CVD, ALD, PVD, a combination thereof, or the like. Examples of conductive materials include copper, tungsten, aluminum, silver, gold, a combination thereof, or the like. Excess conductive material and barrier layer is removed from a surface of the interconnect structure 74 or the semiconductor substrate 72 by, for example, a chemical mechanical polish (CMP). The remaining portions of the barrier layer and conductive material in the recesses form the conductive vias 76.

The dielectric layer 78 is at the front side 70F of the wafer 70. The dielectric layer 78 is in and/or on the interconnect structure 74. In some embodiments, the dielectric layer 78 is an upper dielectric layer of the interconnect structure 74. In some embodiments, the dielectric layer 78 is a passivation layer on the interconnect structure 74. The dielectric layer 78 may be formed of silicon oxide, silicon nitride, polybenzoxazole (PBO), polyimide, a benzocyclobuten (BCB) based polymer, the like, or a combination thereof, which may be formed, for example, by chemical vapor deposition (CVD), spin coating, lamination, or the like.

The bonding pads 82 are at the front side 70F of the wafer 70. The bonding pads 82 may be conductive pillars, pads, or the like, to which external connections can be made. The bonding pads 82 are in and/or on the interconnect structure 74. In some embodiments, the bonding pads 82 are part of an upper metallization pattern of the interconnect structure 74. In some embodiments, the bonding pads 82 include post-passivation interconnects that are electrically coupled to the upper metallization pattern of the interconnect structure 74. The bonding pads 82 can be formed of a conductive material, such as a metal, such as copper, aluminum, or the like, which can be formed by, for example, plating, or the like. The dielectric layer 78 is laterally disposed around the bonding pads 82.

The alignment marks 84 are at the front side 70F of the wafer 70. The alignment marks 84 are in and/or on the interconnect structure 74. In some embodiments, the alignment marks 84 are part of an upper metallization pattern of the interconnect structure 74. In some embodiments, the alignment marks 84 are formed in the dielectric layer 78, separately from the bonding pads 82. The dielectric layer 78 is laterally disposed around the alignment marks 84. A planarization process can be applied to the various layers so that the top surfaces of the dielectric layer 78, the bonding pads 82, and the alignment marks 84 are substantially coplanar (within process variations) and are exposed at the front side 70F of the wafer 70. The planarization process may be a chemical mechanical polish (CMP), an etch-back, combinations thereof, or the like.

As will be subsequently described in greater detail, the planarized front sides 70F of two wafers 70 will be bonded in a face-to-face manner. The alignment marks 84 have a predetermined shape and/or pattern that can be recognized using a camera, so that the wafers 70 may be optically aligned using the alignment marks 84 during wafer bonding. Additionally, and as will be subsequently described in greater detail, the alignment marks 84 are formed of a magnetic material so that the alignment marks 84 of the wafers 70 will be magnetically attracted to one another during alignment, thereby improving the accuracy of wafer alignment. Further yet, the magnetic material of the alignment marks 84 has a high transparency at wavelengths of light used during optical alignment, such as infrared light, such as light having a wavelength of about 1.1 µm (such as in the range of 0.3 µm to 3 µm). Forming the alignment marks 84 of a material with a high transparency can increase the accuracy of optical alignment.

In some embodiments, the magnetic material of the alignment marks 84 is different from the conductive material of the bonding pads 82. The magnetic material of the alignment marks 84 may have a greater resistivity than the conductive material of the bonding pads 82, and may have a greater transparency than the conductive material of the bonding pads 82. In such embodiments, the alignment marks 84 have a stronger magnetization than the bonding pads 82.

The alignment marks 84 may be formed at sites where, depending on the design of the semiconductor dies, additional bonding pads 82 would otherwise be formed. Thus, the alignment marks 84 are in the same device layer (e.g., the dielectric layer 78) as the bonding pads 82. Accordingly, the pattern of the bonding pads 82 and the alignment marks 84 may have increased design flexibility.

Figure 3B:
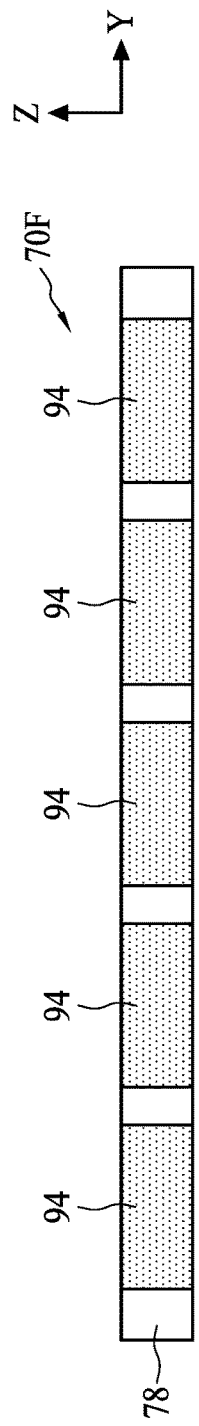
Figure 3A:
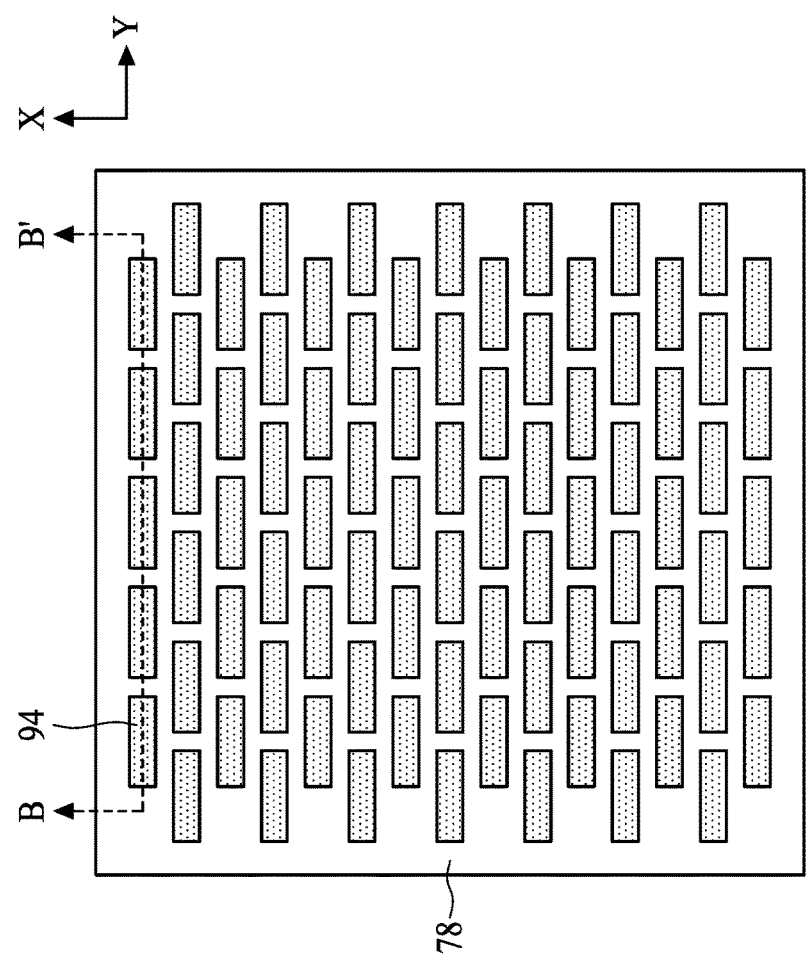
Figure 4B:
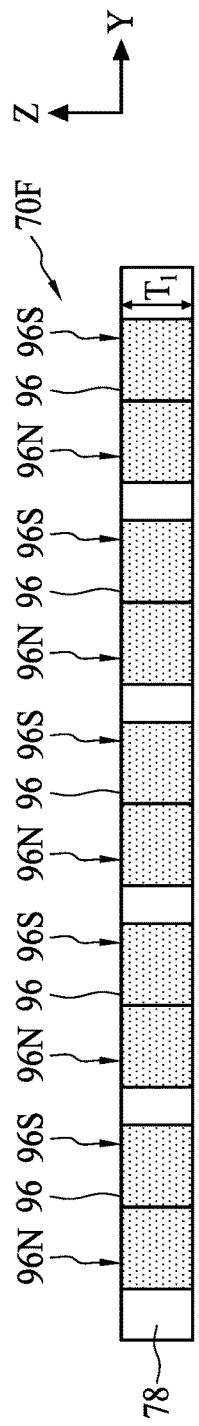

FIGS. 2A-4B are views of intermediate steps during a process for forming an alignment mark 84 for a wafer 70, in accordance with some embodiments. FIGS. 2A, 3A, and 4A are top-down views. FIGS. 2B, 3B, and 4B are cross-sectional views shown along cross-section B-B' in FIGS. 2A, 3A, and 4A, respectively. The alignment mark 84 (see FIG. 4A) includes a plurality of magnetic features 96, which have a predetermined shape and are arranged in a predetermined pattern. In this embodiment, the magnetic features 96 are magnetic bars. In another embodiment (subsequently described for FIG. 20), the magnetic features 96 are magnetic crosses.

In FIGS. 2A-2B, trenches 92 for the magnetic features are patterned in the dielectric layer 78. The trenches 92 may be recesses extending into the dielectric layer 78, or may be openings extending through the dielectric layer 78. The dielectric layer 78 may be patterned by any acceptable process, such as by exposing the dielectric layer 78 to light and developing it when the dielectric layer 78 is a photosensitive material, or by etching using, for example, an anisotropic etch. Timed etching processes may be used to stop the etching of the trenches 92 after the trenches 92 reach a desired depth. The depth of the trenches 92 determines the thickness of the resulting magnetic features 96 (see FIG. 4B), which will be subsequently described in greater detail.

In FIGS. 3A-3B, ferromagnetic features 94 are formed in the trenches 92. The ferromagnetic features 94 are formed of a ferromagnetic material that can be magnetized to form permanent magnets. Examples of ferromagnetic materials include iron (Fe), cobalt (Co), nickel (Ni), alloys thereof such as cobalt-iron-nickel ($Co_xFe_yNi_z$, where x, y, and z are each in the range of 0 to 100), multilayers thereof, or the like, which may be formed by a technique such as deposition (e.g., PVD), plating (e.g., electroplating or electroless plating), or the like. The ferromagnetic material may be doped or undoped. For example, the ferromagnetic material may be cobalt-iron-nickel doped with boron, silicon, molybdenum, combinations thereof, or the like. In some embodiments, each ferromagnetic feature 94 is a single continuous layer of a ferromagnetic material. In some embodiments, each ferromagnetic feature 94 is a conductive material that is doped with a ferromagnetic material.

As an example to form the ferromagnetic features 94, a layer of ferromagnetic material may be conformally formed in the trenches 92 and on the dielectric layer 78. A removal process is performed to remove the excess portions of the ferromagnetic material, which excess portions are over the top surface of the dielectric layer 78, thereby forming the ferromagnetic features 94. After the removal process, the ferromagnetic material has portions left in the trenches 92 (thus forming the ferromagnetic features 94). In some embodiments, a planarization process such as a chemical mechanical polish (CMP), an etch-back process, combinations thereof, or the like may be utilized. After the planarization process, the top surfaces of the dielectric layer 78, the bonding pads 82 (see FIG. 1), and the ferromagnetic features 94 are substantially coplanar (within process variations). The substantially coplanar top surfaces of those features are at the front side 70F of the wafer, and the resulting planar surfaces may be the surfaces that are subsequently used for wafer bonding.

Figure 4A:
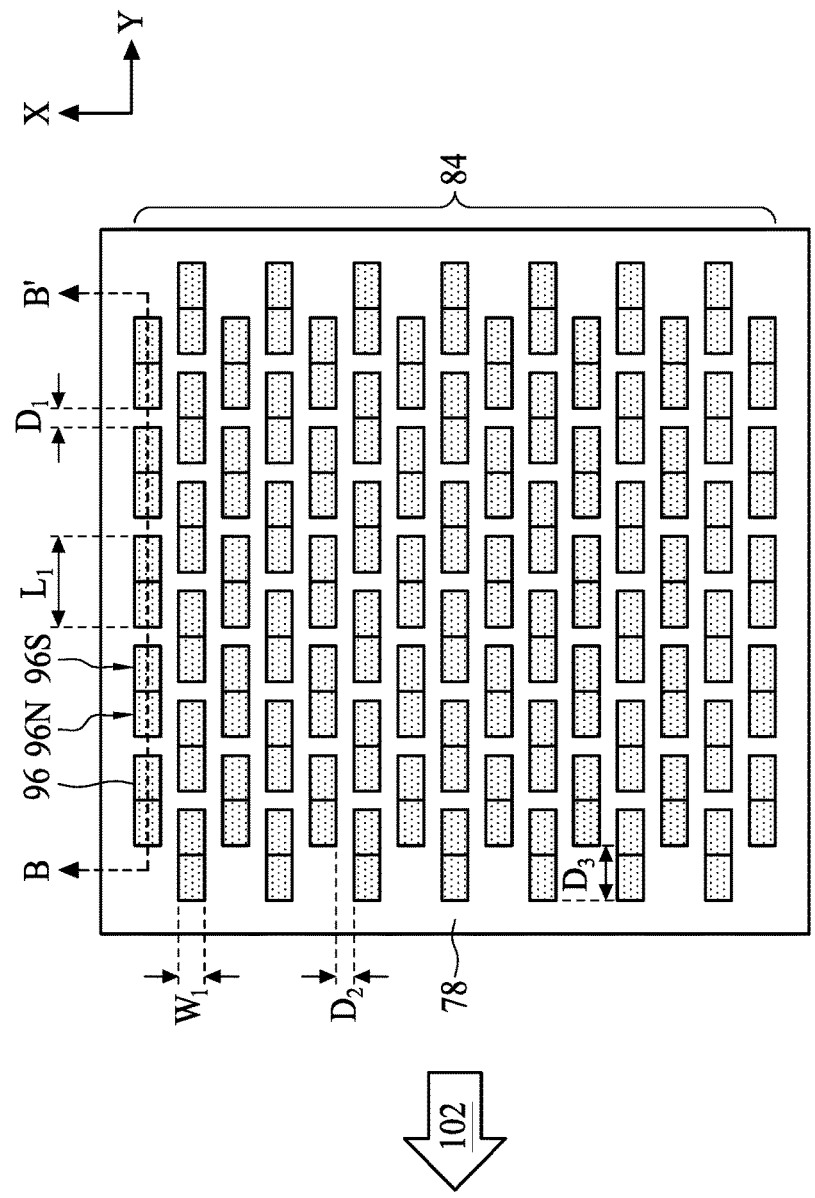

In FIGS. 4A-4B, the ferromagnetic features 94 are magnetized to form magnetic features 96. The magnetic features 96 are permanent magnets, each having a north pole 96N and a south pole 96S. The magnetic features 96 have stronger magnetization than the ferromagnetic features 94. In some embodiments, the magnetic features 96 have a magnetization (M, magnetic moment per volume) of about 750 emu/$cm^3$ (such as in the range of 250 emu/$cm^3$ to 2000 emu/$cm^3$). The ferromagnetic features 94 are magnetized by exposing the ferromagnetic features 94 to a magnetic field 102 (subsequently described) that induces magnetization in the ferromagnetic features 94.

In this embodiment where the magnetic features 96 are magnetic bars, the magnetic bars are arranged in a grid that includes rows of the magnetic bars. The magnetic bars have a high density in each grid. In some embodiments, each alignment mark 84 includes from 1 to 500 magnetic bars. The magnetic bars have a length $L_1$ along a first direction (e.g., the Y-direction), a width $W_1$ along a second direction (e.g., the X-direction), and a thickness $T_1$ along a third direction (e.g., the Z-direction), where the length $L_1$ is greater than the width $W_1$. In some embodiments, the length $L_1$ is in the range of 0.2 µm to 20 µm (such as in the range of 0.2 µm to 10 µm), the width $W_1$ is in the range of 0.2 µm to 20 µm (such as in the range of 0.2 µm to 10 µm), and the thickness $T_1$ is in the range of 0.1 µm to 0.6 µm. The longitudinal axes of the magnetic bars are each aligned along their lengthwise direction (e.g., the Y-direction). In some embodiments, the alignment mark 84 (e.g., the grid of magnetic bars) has a total length in the range of 10 µm to 100 µm and a total width in the range of 10 µm to 100 µm.

The magnetic bars in a row are separated by a distance $D_1$ along the first direction (e.g., the Y-direction), and the rows of the magnetic bars are separated by a distance $D_2$ along the second direction (e.g., the X-direction). In some embodiments, the distance $D_1$ is in the range of 0.1 µm to 0.4 µm, and the distance $D_2$ is in the range of 0.1 µm to 0.4 µm. Within the grid, alternating rows of the magnetic bars are offset from one another along their lengthwise direction (e.g., the Y-direction) by a distance $D_3$, and every other row of the magnetic bars is aligned along their lengthwise direction (e.g., the Y-direction). In some embodiments, the distance $D_3$ is in the range of 0.4 µm to 9.6 µm. Offsetting alternating rows of the magnetic bars can improve the accuracy of an alignment process utilizing the alignment mark 84.

Although not separately illustrated in FIGS. 2A-4B, it should be appreciated that a plurality of alignment marks 84 may simultaneously be formed. For example, groups of trenches 92 may be patterned in the dielectric layer 78, the trenches 92 may be filled with respective ferromagnetic features 94, and the ferromagnetic features 94 may be magnetized to form magnetic features 96. The alignment marks 84 (including the magnetic feature 96 of each alignment mark 84) may be spaced apart by a distance of about 5 µm (such as in the range of 1 µm to 20 µm). The distance between adjacent alignment marks 84 is greater than the distance between adjacent magnetic features 96 of an alignment mark 84.

The magnetic field 102 utilized to magnetize the magnetic feature 96 has a direction that is parallel to the front side 70F (see FIG. 4B) of the wafer, and along the lengthwise direction (e.g., the Y-direction) of the magnetic features 96. As such, the direction of the magnetization induced in the magnetic features 96 is parallel to the lengthwise direction (e.g., the Y-direction) of the magnetic features 96. The magnetic field 102 may be produced by an electromagnet. In some embodiments, the magnetic field 102 has a magnetic field strength of about 1 Tesla (such as in the range of 0.01 Tesla to 2 Tesla), and is applied for a duration of about 5 seconds (such as in the range of 0.01 seconds to 60 seconds).

Figure 5:
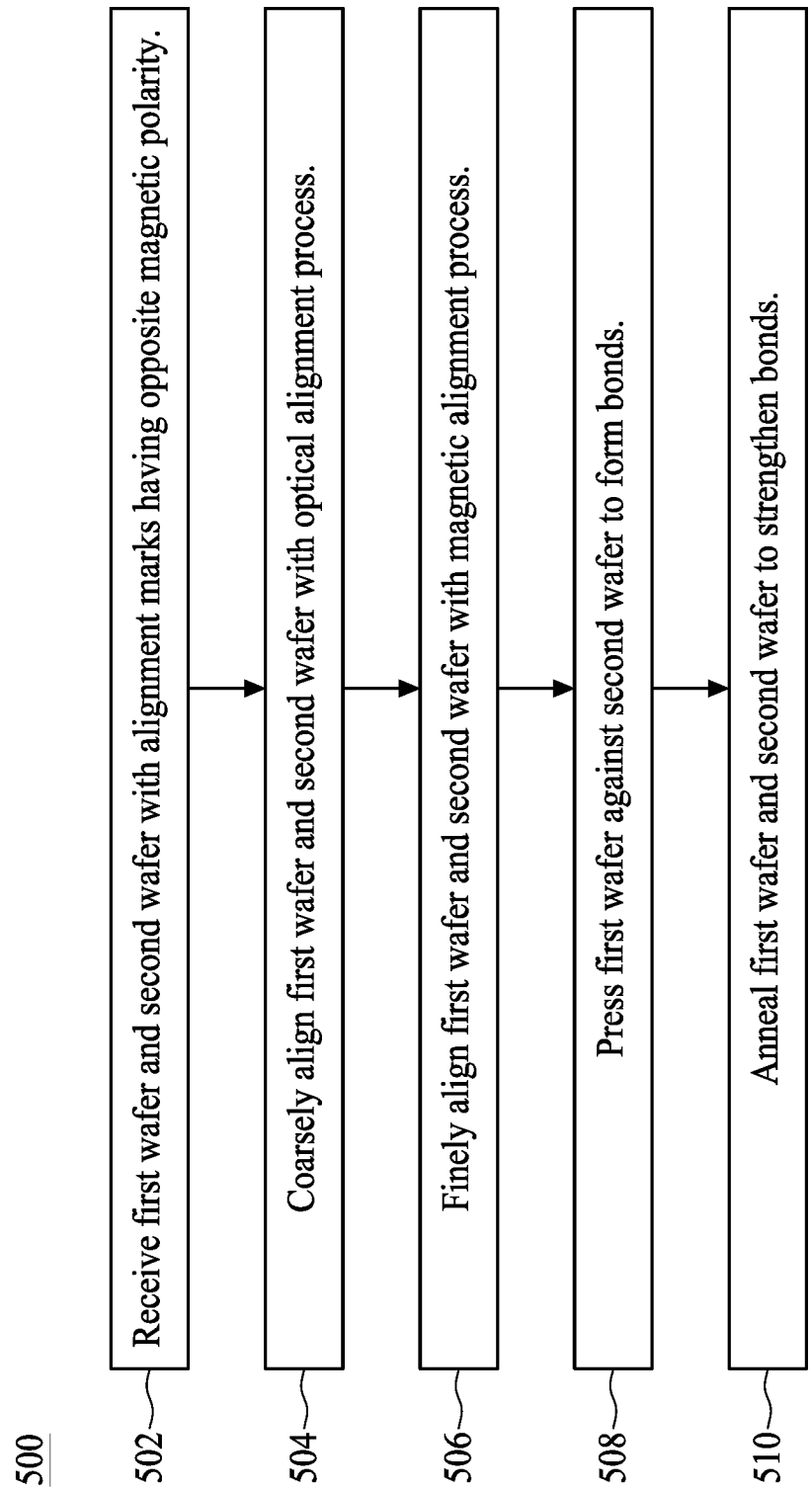
FIG. 5 is a diagram of a wafer bonding method, in accordance with some embodiments.

FIG. 5 is a diagram of a wafer bonding method 500, in accordance with some embodiments. The wafer bonding method 500 will be described in conjunction with FIGS. 6-18, which are various views of intermediate steps during the wafer bonding method 500, in accordance with some embodiments. In the wafer bonding method 500, two wafers 70 (including a first wafer 70A and a second wafer 70B, see FIG. 6) are bonded in a face-to-face manner. In this embodiment, the wafers 70 are bonded in a face-to-face manner by hybrid bonding, such that the front side of the first wafer 70A is bonded to the front side of the second wafer 70B through dielectric-to-dielectric bonds and metal-to-metal bonds. Hybrid bonding allows the wafers 70A, 70B to be bonded without using any adhesive material (e.g., die attach film) or eutectic material (e.g., solder).

In step 502, a first wafer 70A and a second wafer 70B, including, respectively, first alignment marks 84A and second alignment marks 84B (subsequently described for FIG. 7) are received (or formed). One of the wafers 70 will be flipped when the wafers 70 are bonded to one another. Because of this, the wafers 70A, 70B are formed with alignment marks 84A, 84B that include magnetic features 96A, 96B having opposite magnetic polarity. More specifically, the first magnetic features 96A have opposite magnetic polarity from the second magnetic features 96B. As such, the wafers 70A, 70B will be magnetically attracted to one another when they are placed face-to-face.

Figure 7:
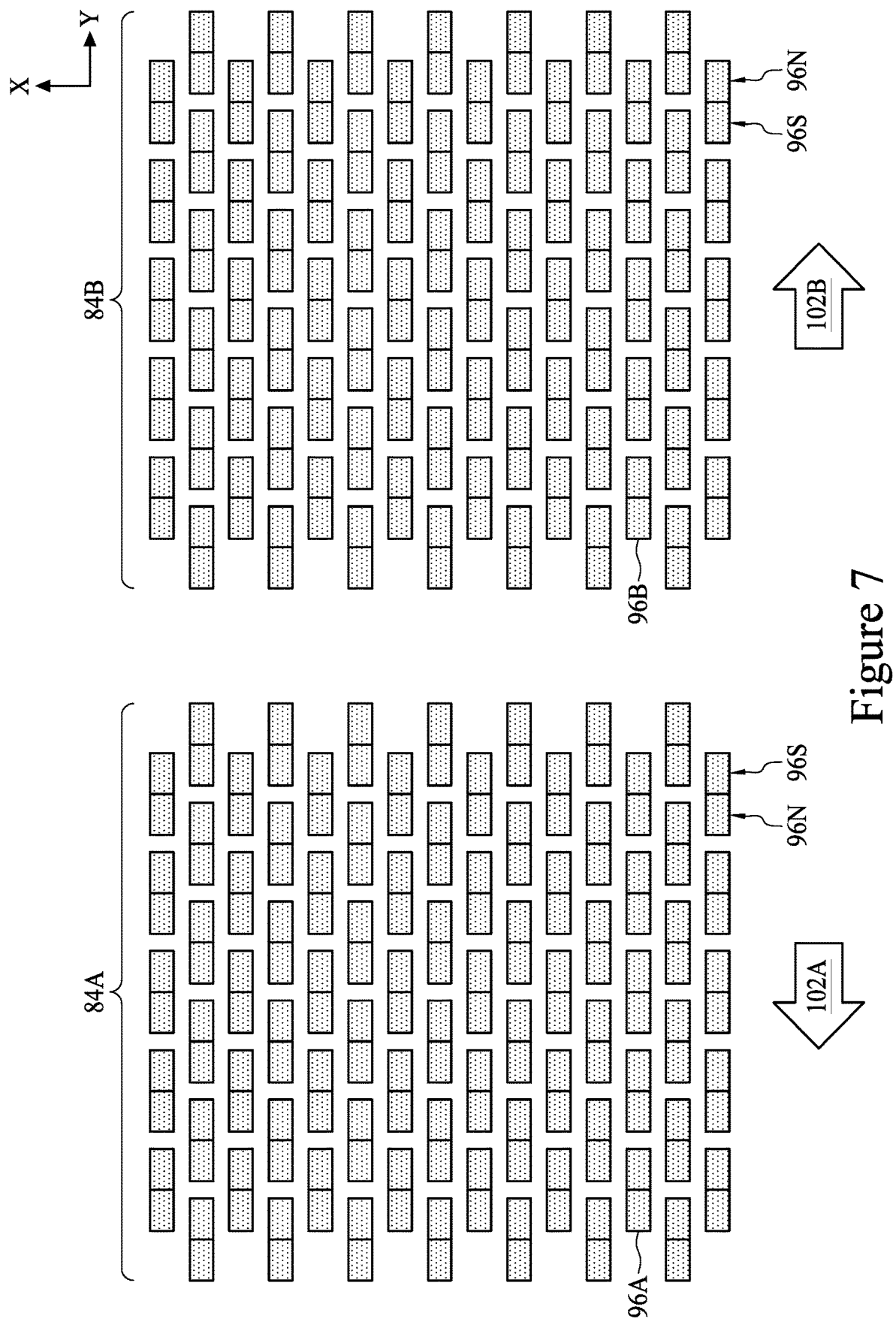

Referring to FIG. 6 (a simplified top-down view of the wafers 70A, 70B) and FIG. 7 (a top-down view of alignment marks 84A, 84B), the wafers 70A, 70B are shown at a similar step of processing as described for FIGS. 4A-4B, where the magnetic features 96A, 96B are magnetized. When magnetizing the magnetic features 96A, 96B, different magnetic fields 102A, 102B are applied to the wafers 70A, 70B. Specifically, a first magnetic field 102A is applied to the first wafer 70A to magnetize the first magnetic features 96A of the first wafer 70A, and a second magnetic field 102B is applied to the second wafer 70B to magnetize the second magnetic features 96B of the second wafer 70B. The first magnetic field 102A may (or may not) have the same strength as the second magnetic field 102B, and the first magnetic field 102A is anti-parallel to the second magnetic field 102B such that the first magnetic field 102A has opposite polarity (e.g., opposite direction) from the second magnetic field 102B. As a result, the magnetization of the first magnetic features 96A may (or may not) have the same strength as the magnetization of the second magnetic features 96B, but the magnetization of the first magnetic features 96A has opposite polarity from the magnetization of the second magnetic features 96B. As such, the first magnetic features 96A will be attracted to the second magnetic features 96B when the wafers 70A, 70B are placed face-to-face. The directions of the magnetic fields 102A, 102B are relative to the respective wafers 70A, 70B. In some embodiments, the directions of the magnetic fields 102A, 102B are relative to notches 88 in the wafers 70A, 70B.

Figure 8:
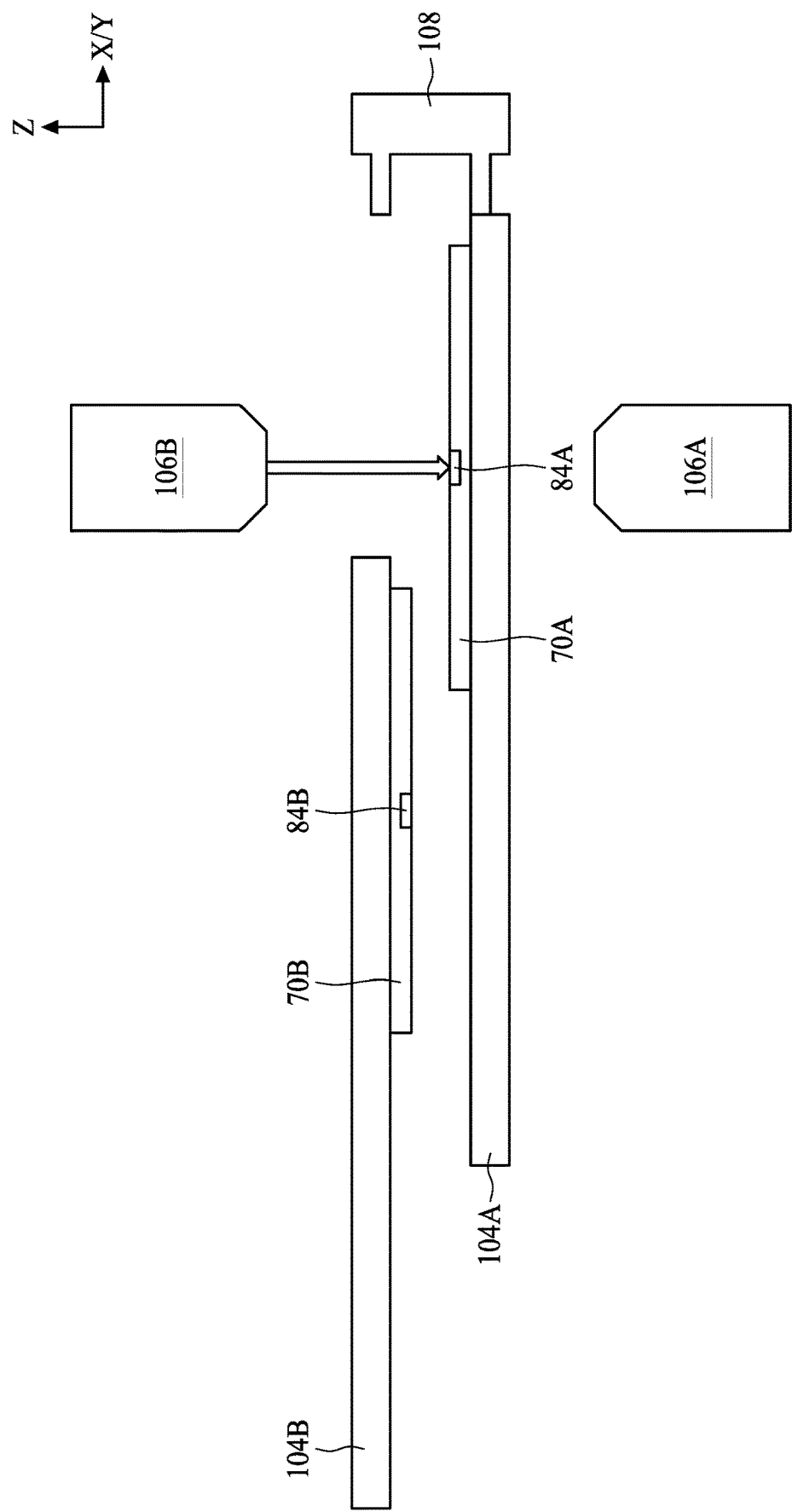
Figure 9:
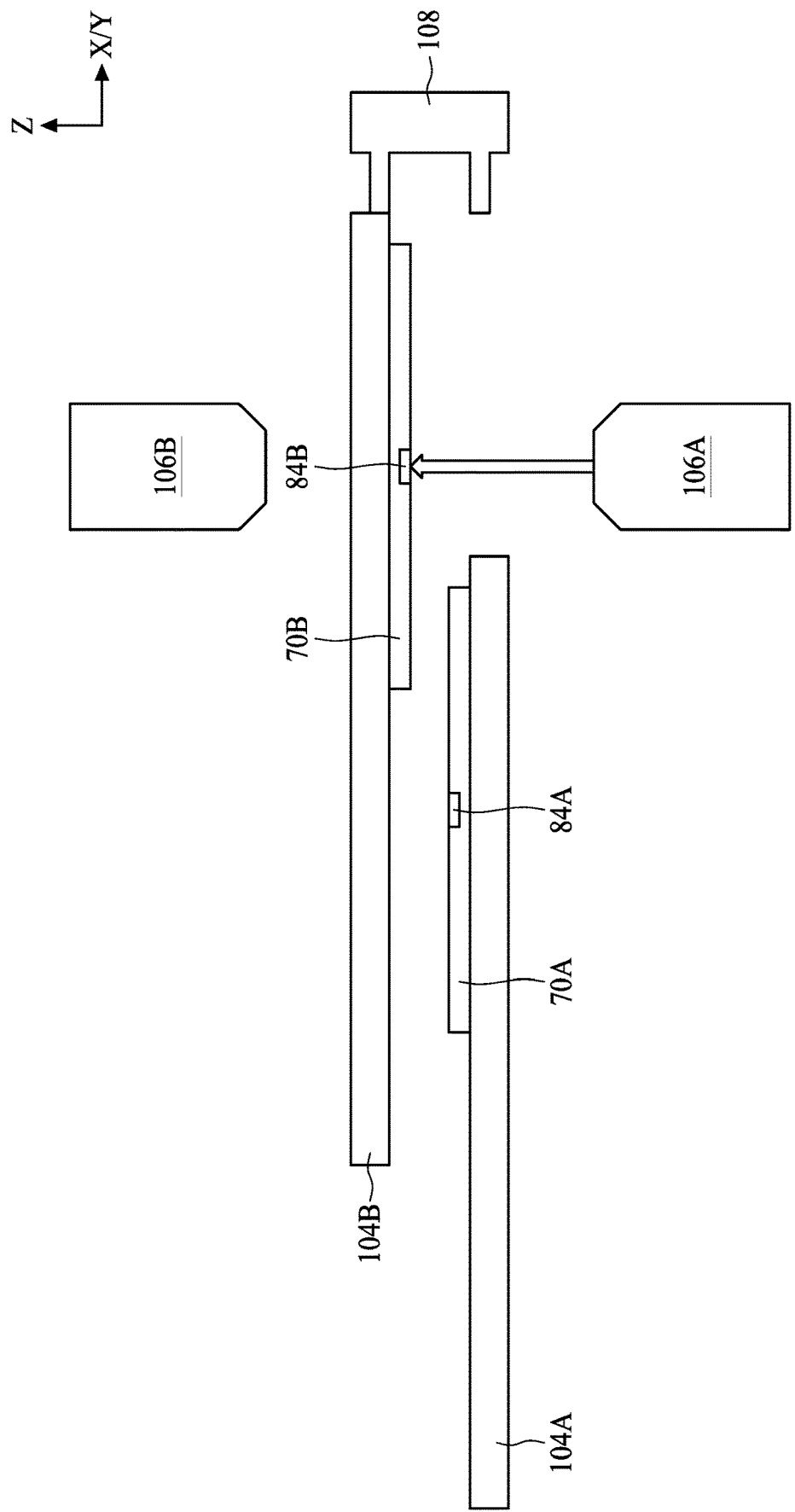
Figure 10:
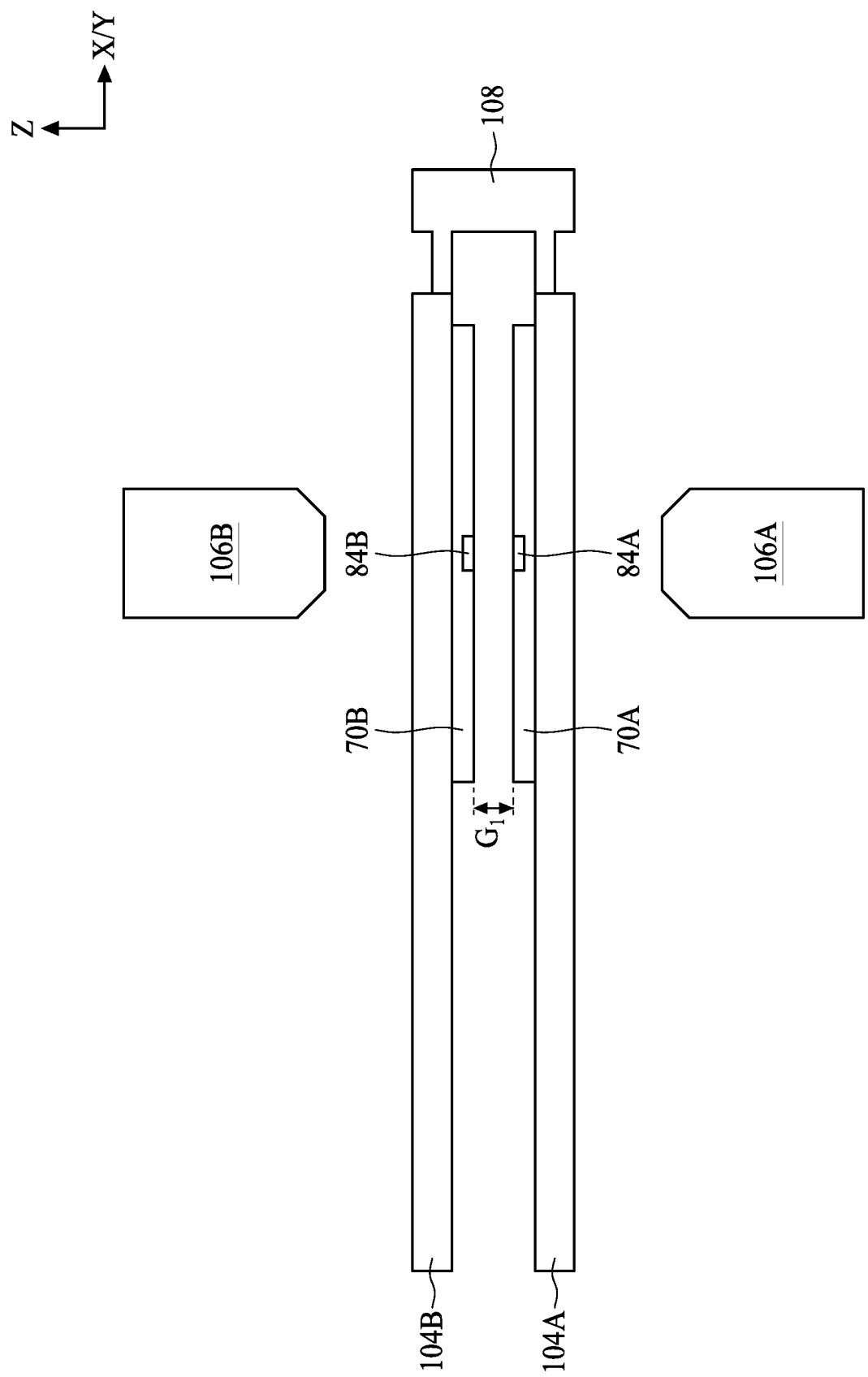

In step 504, the wafers 70A, 70B are coarsely aligned in a first alignment process. Referring to FIGS. 8-10, the wafers 70A, 70B are shown during steps of the first alignment process. One of each of the alignment marks 84A, 84B are schematically illustrated, but as previously noted, each of the wafers 70A, 70B may include a plurality of alignment marks. The first alignment process is an optical alignment process that utilizes cameras 106A, 106B, such as infrared cameras. The first wafer 70A is placed on a lower chuck 104A, and the second wafer 70B is placed on an upper chuck 104B. The chucks 104A, 104B are operable to horizontally move the wafers 70A, 70B (e.g., in the X/Y-plane) and to vertically move the wafers 70A, 70B (e.g., along the Z-direction). During the first alignment process, the chucks 104A, 104B are positioned far enough apart that the magnetic attraction between the alignment marks 84A, 84B is insufficient to move the wafers 70A, 70B. In some embodiments, the chucks 104A, 104B are positioned so that a gap $G_1$ (see FIG. 10) between the wafers 70A, 70B (e.g., between the alignment marks 84A, 84B) is about 3 mm (such as in the range of 0.1 mm to 10 mm).

The first alignment process includes searching for the first alignment marks 84A of the first wafer 70A using the upper camera 106B, as shown by FIG. 8. The upper camera 106B is disposed at a fixed location, and the lower chuck 104A is horizontally moved in the X/Y-plane until the upper camera 106B detects the first alignment marks 84A are at desired locations that indicate correct wafer alignment. The position of the lower chuck 104A (which is an aligned position of the lower chuck 104A) is then measured using a positioning sensor 108. The aligned position of the lower chuck 104A is recorded. The lower chuck 104A may then be retracted so that it is out of the line-of-sight of the cameras 106A, 106B.

The first alignment process further includes searching for second alignment marks 84B of the second wafer 70B using the lower camera 106A, as shown by FIG. 9. The lower camera 106A is disposed at a fixed location, and the upper chuck 104B is horizontally moved in the X/Y-plane until the lower camera 106A detects the second alignment marks 84B are at desired locations that indicate correct wafer alignment. The position of the upper chuck 104B (which is an aligned position of the upper chuck 104B) is then measured using the positioning sensor 108. The aligned position of the upper chuck 104B is recorded.

The first alignment process further includes horizontally moving the chucks 104A, 104B in the X/Y-plane to their aligned positions, as determined by the positioning sensor 108. When the chucks 104A, 104B are in their aligned positions, the first wafer 70A is coarsely aligned with the second wafer 70B. After the wafers 70A, 70B are coarsely aligned, the amount of misalignment between them may be large. In some embodiments, the wafers 70A, 70B have more than about 0.2 μm of misalignment (such as in the range of 0.2 μm to 0.4 μm of misalignment).

Figure 11:
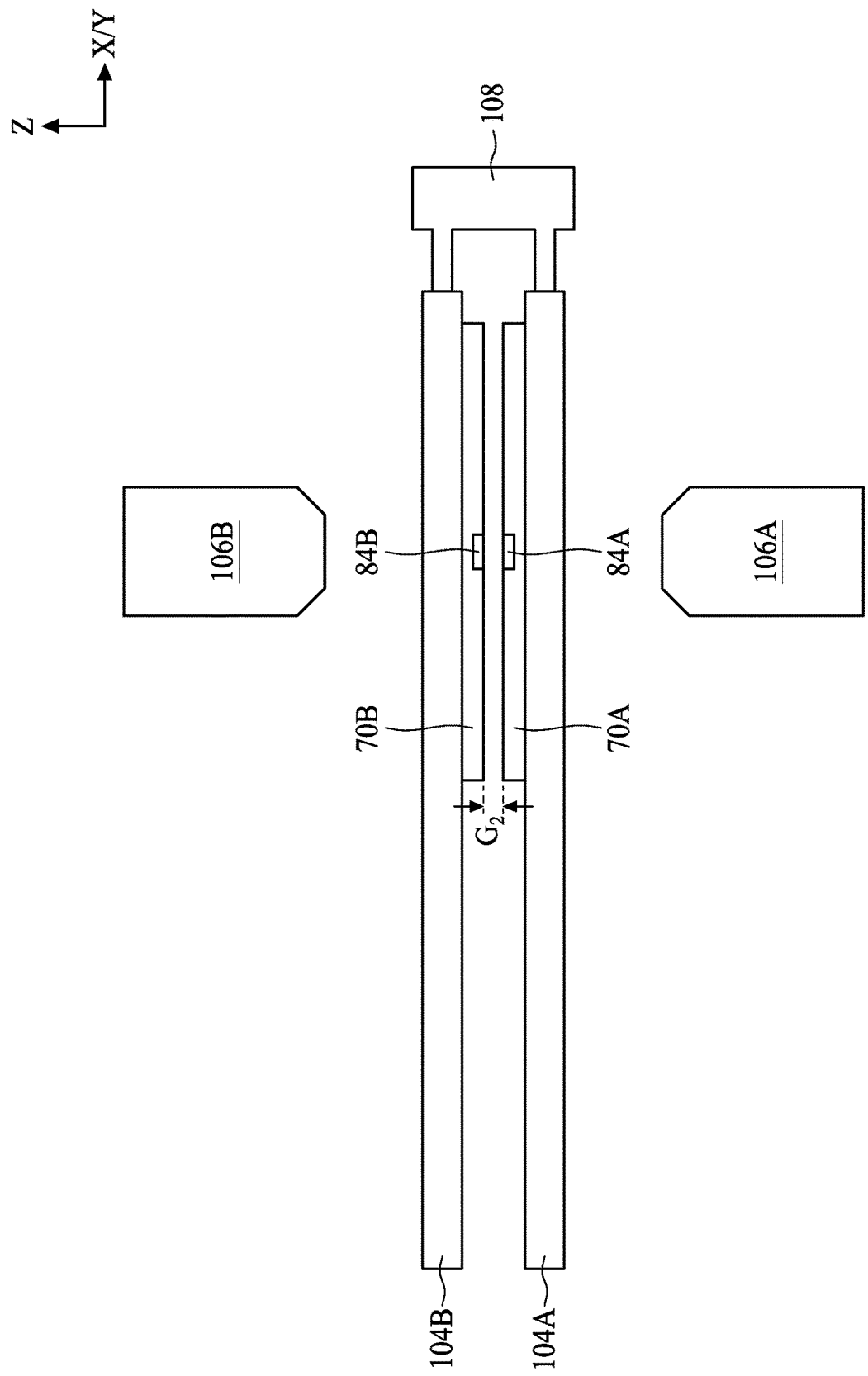

In step 506, the wafers 70A, 70B are finely aligned in a second alignment process. Referring to FIG. 11, the wafers 70A, 70B are shown during the second alignment process. The second alignment process is a magnetic alignment process that utilizes the alignment marks 84A, 84B. The second alignment process is a self-alignment process. During the second alignment process, the chucks 104A, 104B are positioned close enough together that the magnetic attraction between the alignment marks 84A, 84B is sufficient to move the wafers 70A, 70B. In some embodiments, the chucks 104A, 104B are positioned so that a gap $G_2$ between the wafers 70A, 70B (e.g., between the alignment marks 84A, 84B) is about 0.6 μm (such as in the range of 0.4 μm to 0.8 μm). The chucks 104A, 104B are closer together during the second alignment process than during the first alignment process.

Figure 12:
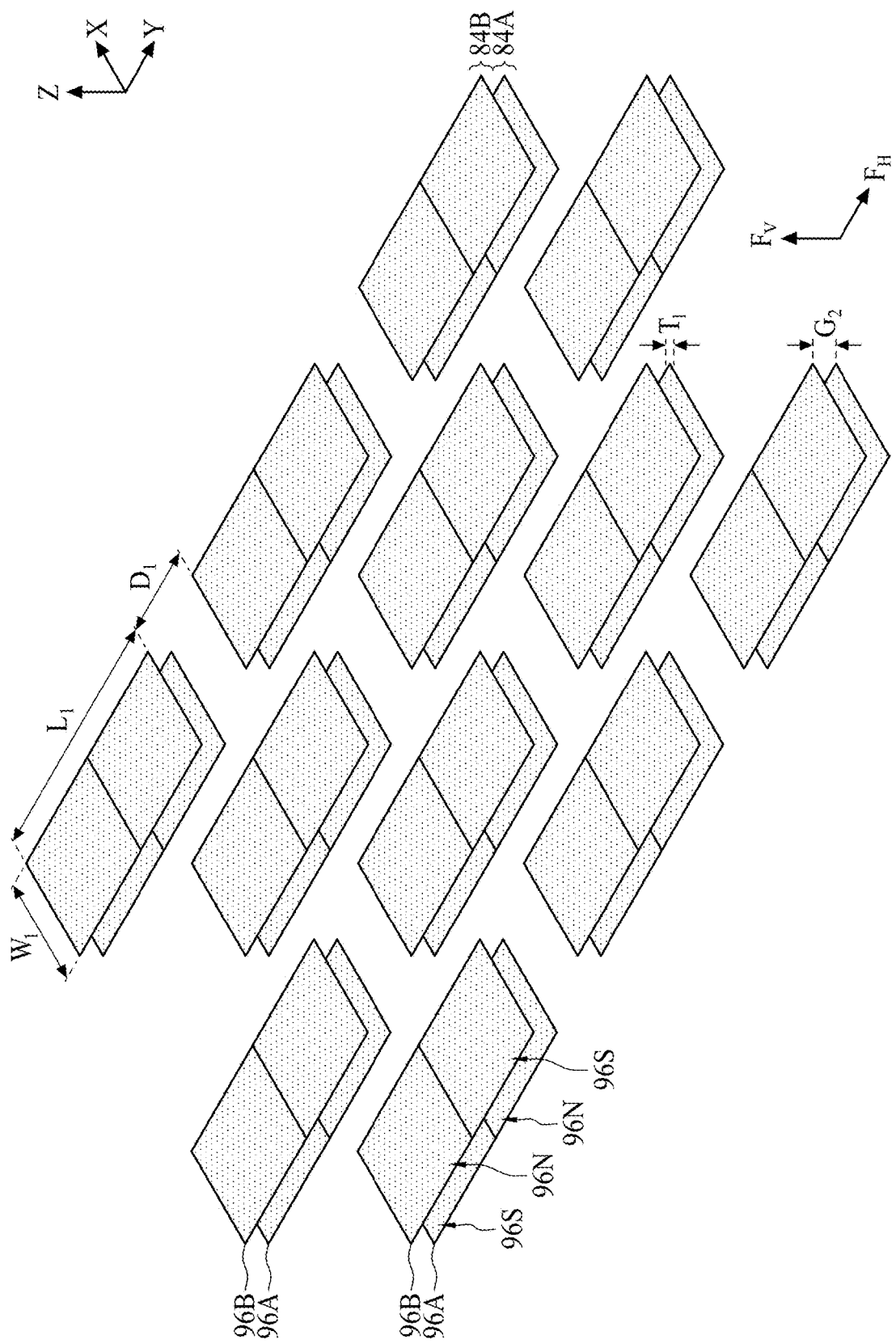

Referring to FIG. 12, some of the magnetic features 96A, 96B of two alignment marks 84A, 84B are shown. Because the magnetic features 96A, 96B are magnetically attracted, the alignment marks 84A, 84B exert two forces on the wafers 70A, 70B (see FIG. 11): a horizontal force $F_H$ (e.g., in the X/Y-plane) and a vertical force $F_V$ (e.g., along the Z-direction). The vertical force $F_V$ draws the wafers 70A, 70B towards each other. The horizontal force $F_H$ draws the north poles 96N of the magnetic features 96A, 96B towards the south poles 96S of the magnetic features 96A, 96B. The horizontal force $F_H$ is greater than the vertical force $F_V$, which improves the accuracy of the second alignment process. Specifically, the vertical force $F_V$ is not strong enough to move the wafers 70A, 70B along the Z-direction, but the horizontal force $F_H$ is strong enough to move the wafers 70A, 70B in the X/Y-plane. In some embodiments, the vertical force $F_V$ is in the range of 0.001 μNewtons to 10 μNewtons, and the horizontal force $F_H$ is in the range of 0.001 μNewtons to 10 μNewtons. As noted above, the magnetic features 96A, 96B of the alignment marks 84A, 84B have opposite magnetic polarity. Because of this, when the wafers 70A, 70B are moved in the X/Y-plane, the north poles 96N of the first magnetic features 96A are aligned with the south poles 96S of the second magnetic features 96B, and the south poles 96S of the first magnetic features 96A are aligned with the north poles 96N of the second magnetic features 96B.

The relative strengths of the horizontal force $F_H$ and the vertical force $F_V$ are determined by the thickness $T_1$ (previously described) of the magnetic features 96A, 96B, and also by the gap $G_2$ (previously described) between the magnetic features 96A of the first wafer 70A and the magnetic features 96B of the second wafer 70B during the second alignment process. A force coefficient is the ratio of the horizontal force $F_H$ generated by the alignment marks 84A, 84B to the vertical force $F_V$ generated by the alignment marks 84A, 84B. In some embodiments, the force coefficient is in the range of 1 to 2. A greater force coefficient indicates a greater horizontal force $F_H$ is generated during the second alignment process, relative the vertical force $F_V$. Increasing the horizontal force $F_H$ generated during the second alignment process decreases the final misalignment between the alignment marks 84A, 84B (and thus the wafers 70A, 70B). In an experiment, the gap $G_2$ was in the range of 0.6 μm to 0.8 μm and the thickness $T_1$ was in the range of 0.1 μm to 0.6 μm, thereby obtaining a force coefficient in the range of 1.18 to 1.63.

The second alignment process includes vertically moving the chucks 104A, 104B (see FIG. 11) towards each other along the Z-direction until the alignment marks 84A, 84B generate a desired horizontal force $F_H$ and vertical force $F_V$. This begins moving the alignment marks 84A, 84B to aligned positions. As previously noted, the horizontal force $F_H$ is sufficient to move the wafers 70A, 70B in the X/Y-plane, and the vertical force $F_V$ is insufficient to move the wafers 70A, 70B along the Z-direction. Movement of the chucks 104A, 104B is then stopped and a wait is performed in which the chucks 104A, 104B are held at the desired position until the wafers 70A, 70B have finished moving to their aligned positions (e.g., until the north poles 96N are aligned with the south poles 96S). In some embodiments, the second alignment process includes waiting while the chucks 104A, 104B are held at the desired position for a duration of about 500 μs (such as in the range of 10 μs to 5000 μs). When the north poles 96N are aligned with the south poles 96S, the first wafer 70A is finely aligned with the second wafer 70B. After the wafers 70A, 70B are finely aligned, the amount of misalignment between them is small. In some embodiments, the wafers 70A, 70B have less than about 0.1 μm of misalignment (such as in the range of 0.01 μm to 0.5 μm of misalignment). Performing the second alignment process (e.g., magnetic self-alignment) in addition to the first alignment process (e.g., optical alignment) allows the misalignment between the wafers 70A, 70B to be less than if the first alignment process were used alone.

Figure 13:
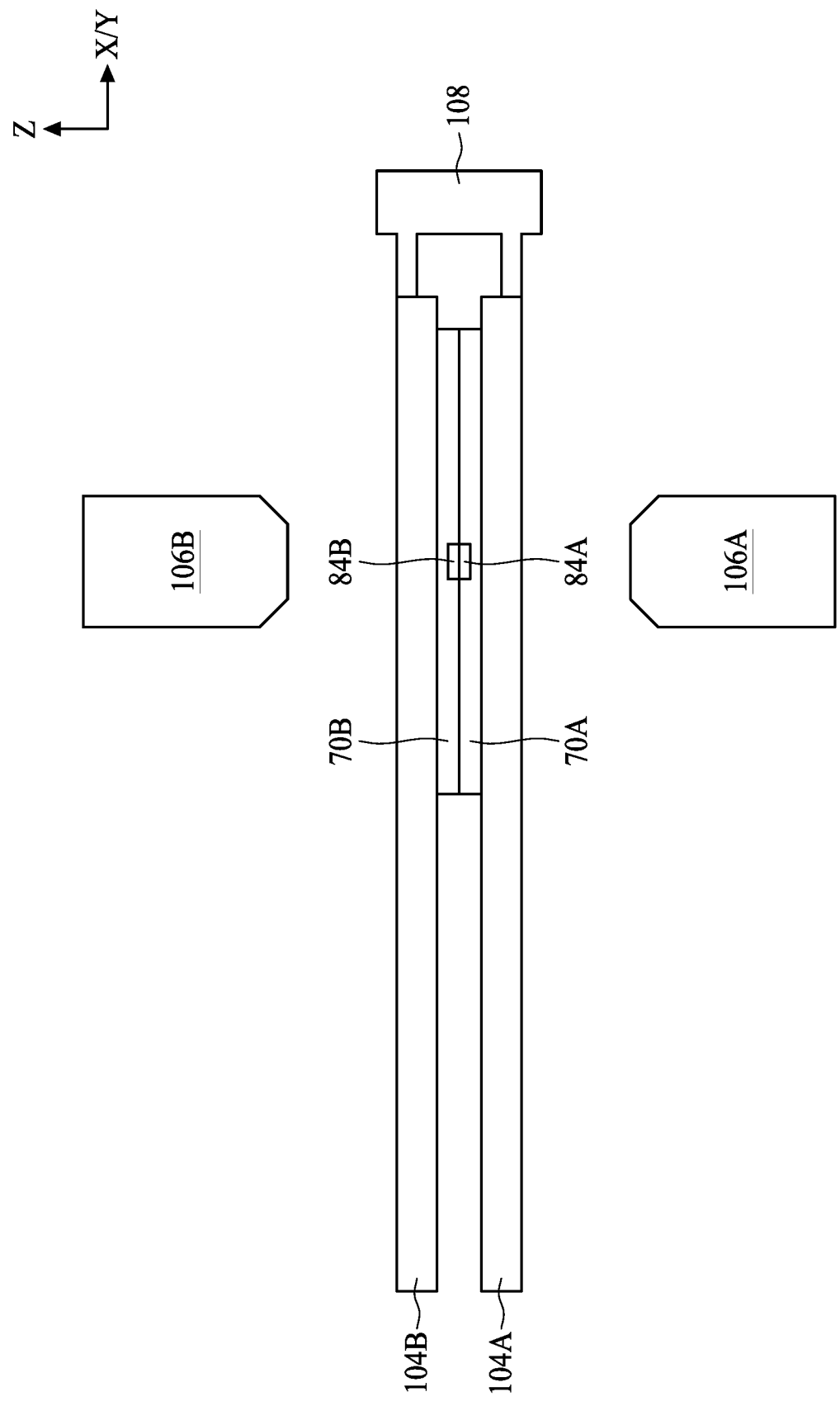
Figure 14:
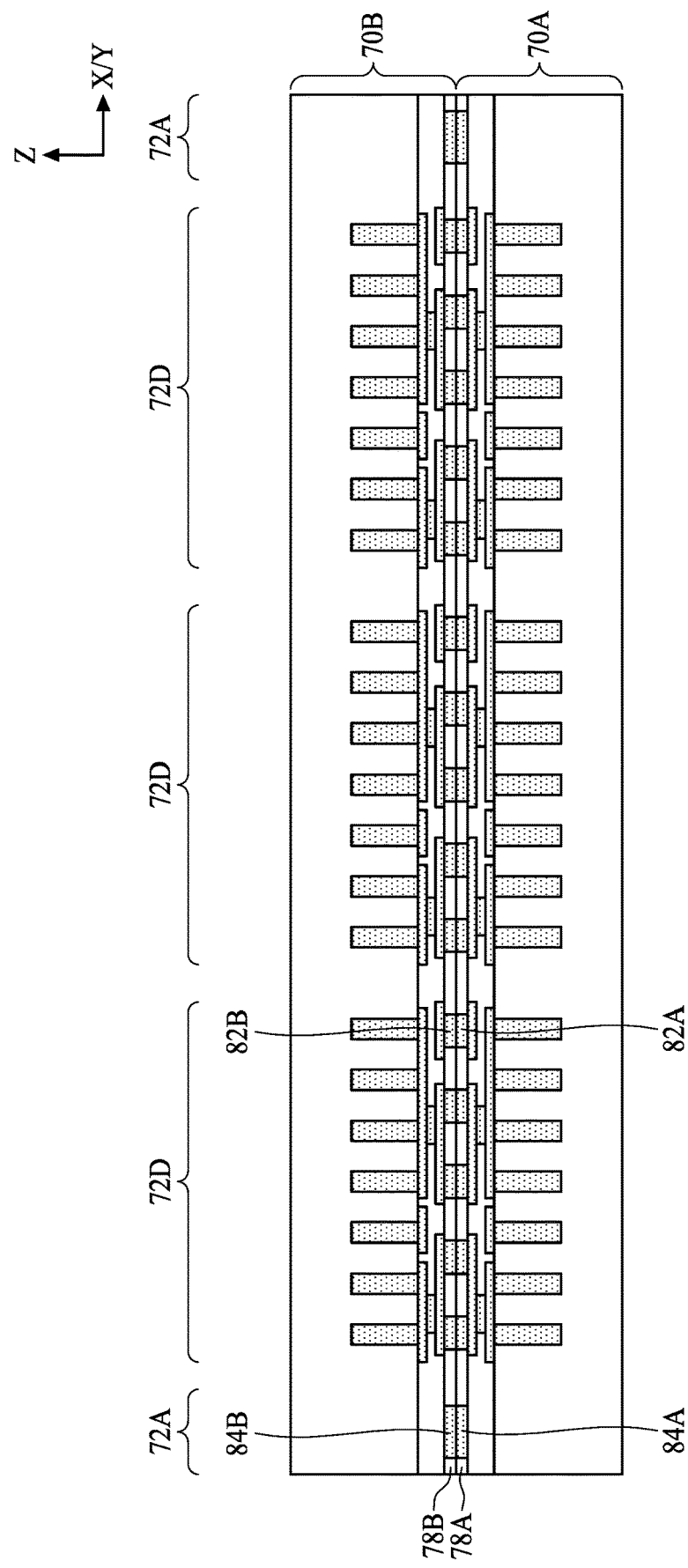

In step 508, a pre-bonding process is performed by bringing the front sides of the wafers 70A, 70B into contact with one another. Referring to FIG. 13, the wafers 70A, 70B are shown after the wafers 70A, 70B are contacted. During the pre-bonding, a small pressing force is applied by vertically moving the chucks 104A, 104B towards each other to press the first wafer 70A against the second wafer 70B. FIG. 14 is a cross-sectional view of the wafers 70A, 70B during bonding. When the wafers 70A, 70B are pressed together, the dielectric layers 78A, 78B are brought into contact. The pre-bonding is performed at a low temperature, such as about room temperature (such as in the range of 15° C. to 30° C.), and after the pre-bonding, the dielectric layers 78A, 78B are bonded to each other.

In step 510, an annealing process is performed to improve the bonding strength between the wafers 70A, 70B. During the annealing process, the dielectric layers 78A, 78B; the bonding pads 82A, 82B; and the alignment marks 84A, 84B are annealed at a high temperature, such as a temperature in the range of 100° C. to 450° C. After the annealing, bonds, such as fusions bonds, are formed bonding the dielectric layers 78A, 78B. For example, the bonds can be covalent bonds between the material of the dielectric layer 78A and the material of the dielectric layer 78B. The bonding pads 82A, 82B are connected to each other with a one-to-one correspondence. The bonding pads 82A, 82B may be in physical contact after the pre-bonding, or may expand to be brought into physical contact during the annealing. Further, during the annealing, the material of the bonding pads 82A, 82B (e.g., copper) intermingles, so that metal-to-metal bonds are also formed. The alignment marks 84A, 84B are also connected to each other with a one-to-one correspondence, and metal-to-metal bonds may be formed between the alignment marks 84A, 84B in a similar manner as the bonding pads 82A, 82B. Hence, the resulting bonds between the wafers 70A, 70B are hybrid bonds that include both dielectric-to-dielectric bonds and metal-to-metal bonds.

Figure 15:
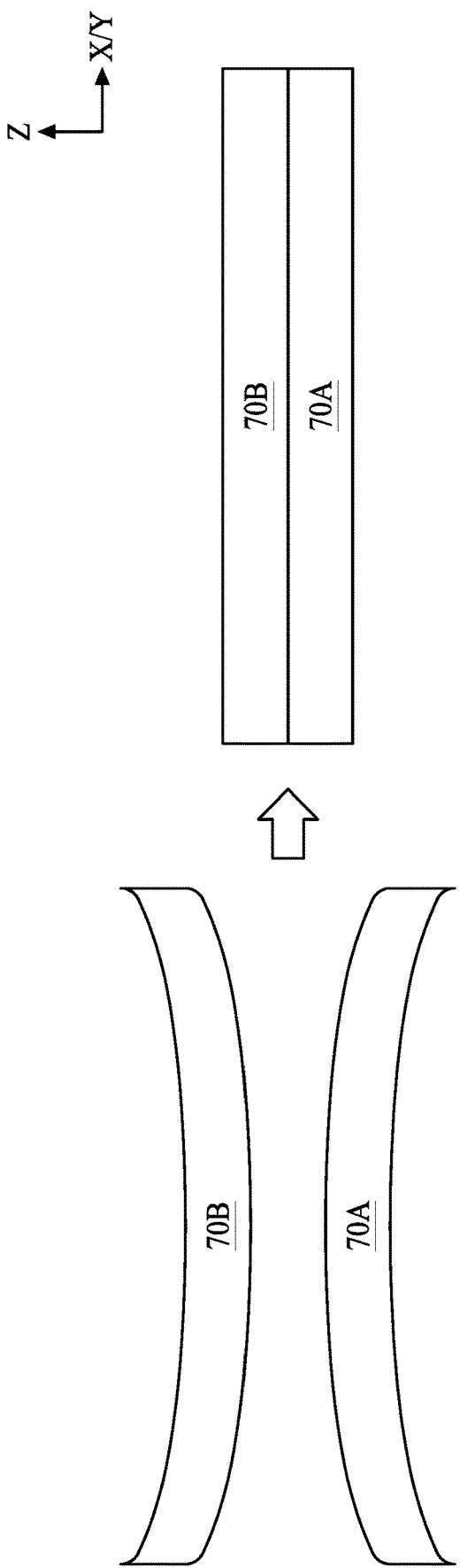
Figure 16:
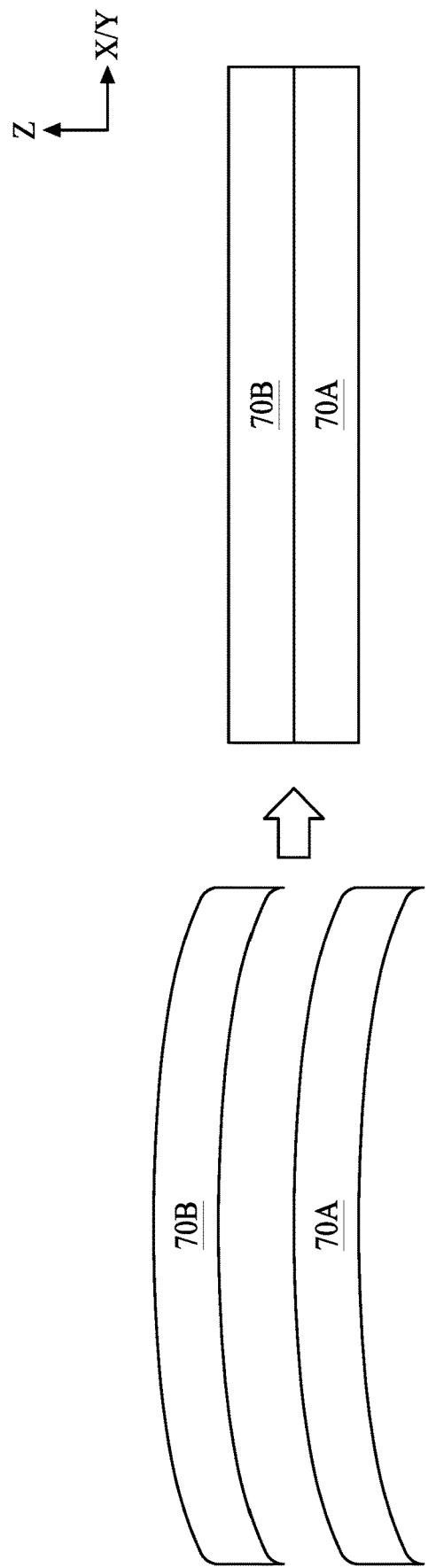
Figure 17:
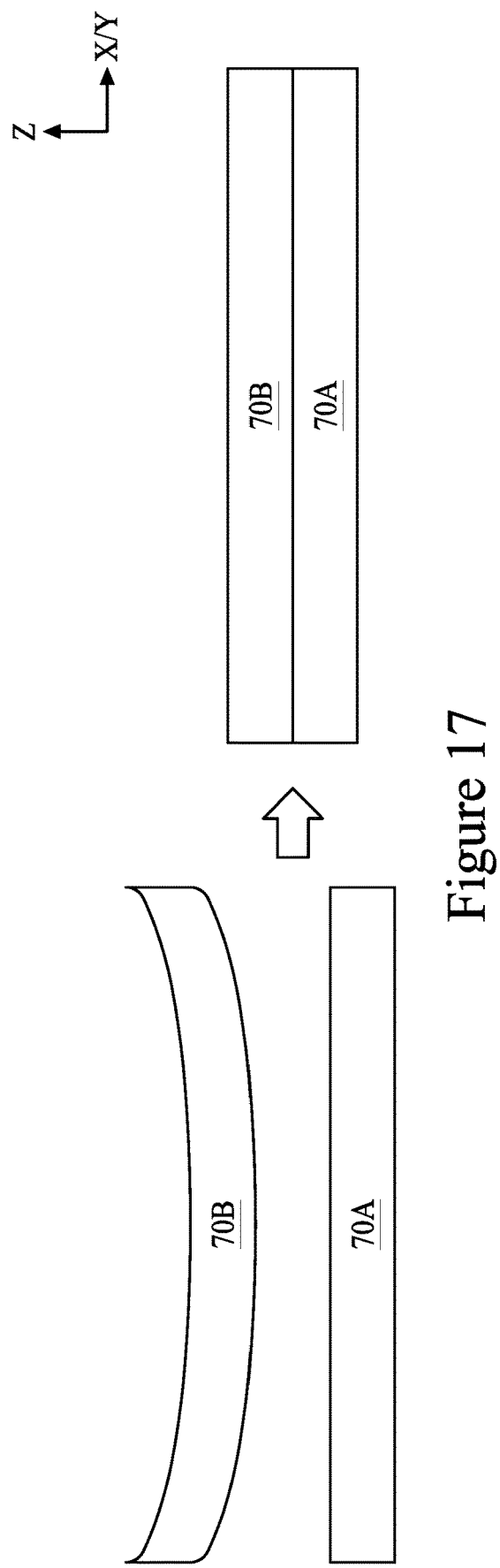
Figure 18:
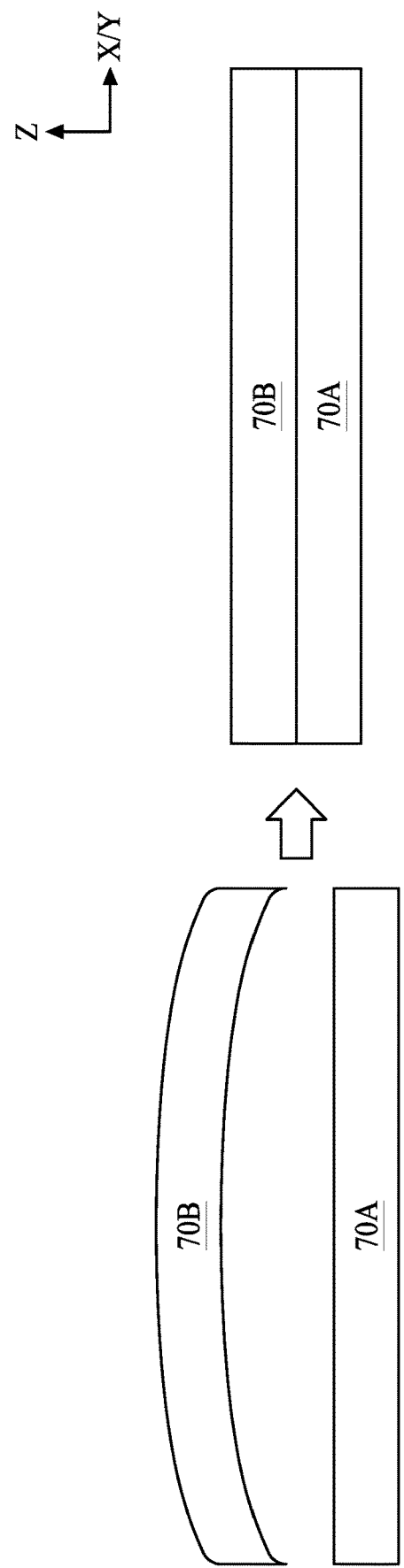

The vertical force $F_V$, although not large enough to move the wafers 70A, 70B along the Z-direction during wafer bonding, is large enough to bend the wafers 70A, 70B when the wafers 70A, 70B are contacted. Therefore, in addition to aiding with alignment during wafer bonding, utilizing the magnetic alignment marks 84A, 84B can help reduce warpage of the wafers 70A, 70B. In some embodiments, as shown by FIG. 15, the first wafer 70A and the second wafer 70B have convex warpage before bonding, and bonding the wafers 70A, 70B with magnetic alignment marks reduces their warpage. In some embodiments, as shown by FIG. 16, the first wafer 70A has convex warpage and the second wafer 70B has concave warpage before bonding, and bonding the wafers 70A, 70B with magnetic alignment marks reduces their warpage. In some embodiments, as shown by FIG. 17, the first wafer 70A has no warpage and the second wafer 70B has convex warpage before bonding, and bonding the wafers 70A, 70B with magnetic alignment marks reduces their warpage. In some embodiments, as shown by FIG. 18, the first wafer 70A has no warpage and the second wafer 70B has concave warpage before bonding, and bonding the wafers 70A, 70B with magnetic alignment marks reduces their warpage. Reducing warpage of the wafers 70A, 70B can further improve accuracy of their alignment.

Additional processing may be performed after the wafers 70A, 70B are bonded. For example, and referring again to FIG. 14, the bonded wafer structure may be singulated by sawing along scribe line regions, e.g., between the device regions 72D. The sawing singulates the bonded devices in each device region 72D to form bonded device structures. In embodiments where the alignment marks 84 are formed in the device regions 72D, the bonded device structures may include the alignment marks 84. In embodiments where the alignment marks 84 are formed in separate alignment mark regions 72A, the bonded device structures may not include the alignment marks 84.

Embodiments may achieve advantages. Forming the magnetic alignment marks 84 in the wafers 70 may improve the accuracy of an alignment process during bonding of the wafers 70. Specifically, two wafers 70A, 70B are formed with alignment marks 84A, 84B that have opposite magnetic polarity. As a result, the first alignment marks 84A are magnetically attracted to the second alignment marks 84B when the wafers 70A, 70B are bonded together. The magnetic attraction between the alignment marks 84A, 84B generates a horizontal force in a horizontal plane (that is parallel to the front sides 70F of the wafers 70A, 70B), and the horizontal force is large enough to move the wafers in the horizontal plane such that the first alignment marks 84A are aligned with the second alignment marks 84B. Magnetic self-alignment between the wafers 70A, 70B may thus be achieved, and utilizing magnetic self-alignment during bonding may reduce misalignment between the bonded wafers 70A, 70B.

Figure 19:
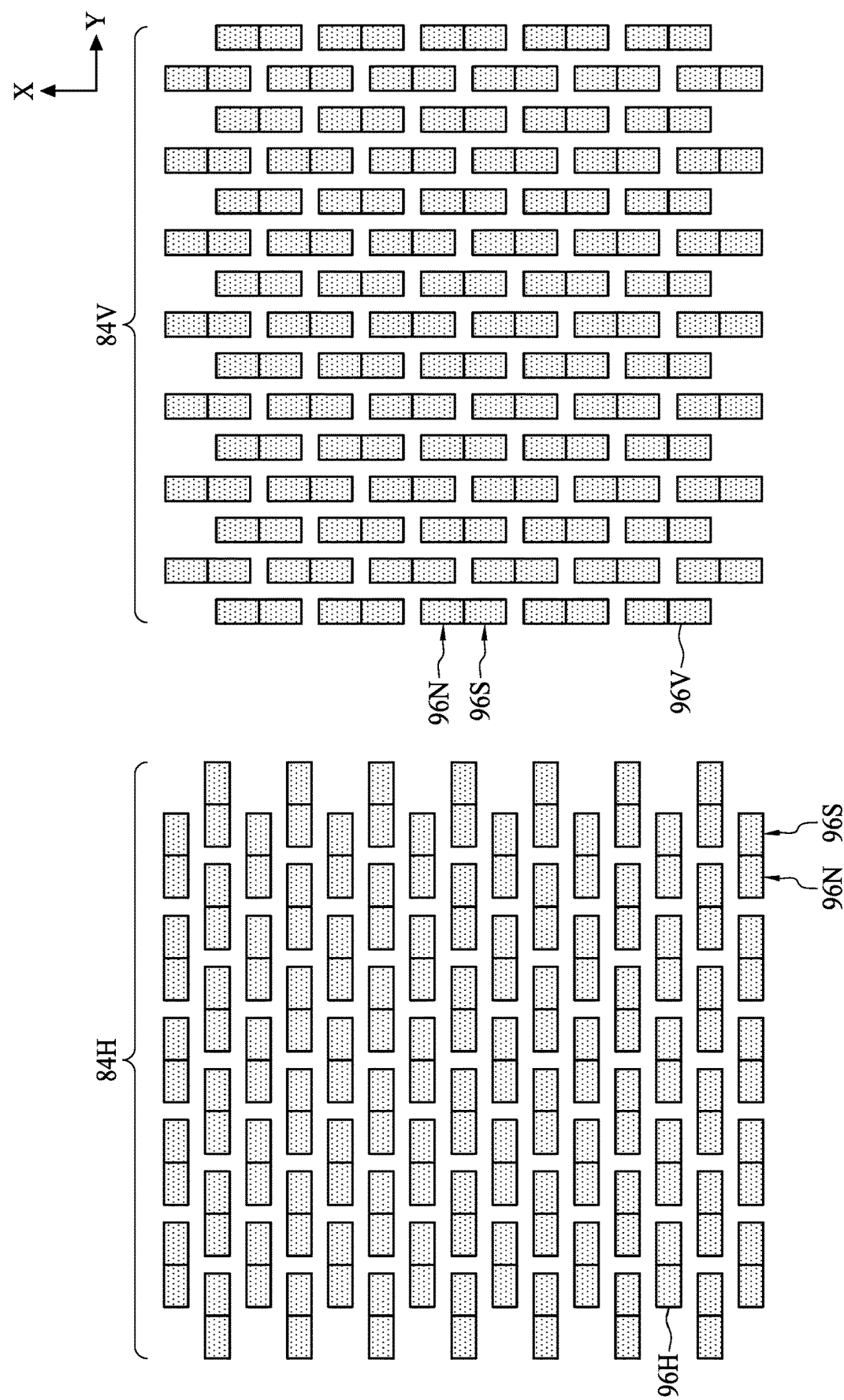
FIGS. 19-20 are top-down views of alignment marks, in accordance with various embodiments.

FIG. 19 is a top-down view of alignment marks 84, in accordance with some other embodiments. Similar to the previous embodiments, each alignment mark 84 includes a plurality of magnetic features 96, which are magnetic bars. In this embodiment, the alignment marks 84 include a horizontal alignment mark 84H and a vertical alignment mark 84V on a same wafer. The horizontal alignment mark 84H includes a plurality of horizontal magnetic bars 96H. The vertical alignment mark 84V includes a plurality of vertical magnetic bars 96V. The lengthwise direction of the horizontal magnetic bars 96H is perpendicular to the lengthwise direction of the vertical magnetic bars 96V. Further, the direction of magnetization of the horizontal magnetic bars 96H is perpendicular to the direction of magnetization of the vertical magnetic bars 96V. Forming both horizontal magnetic bars 96H and of vertical magnetic bars 96V on a same wafer can decrease misalignment during the second alignment process (previously described for FIGS. 11-12). Specifically, forming the alignment marks 84H, 84V with longitudinal axes along multiple directions can increase alignment accuracy along both directions during bonding.

Figure 20:
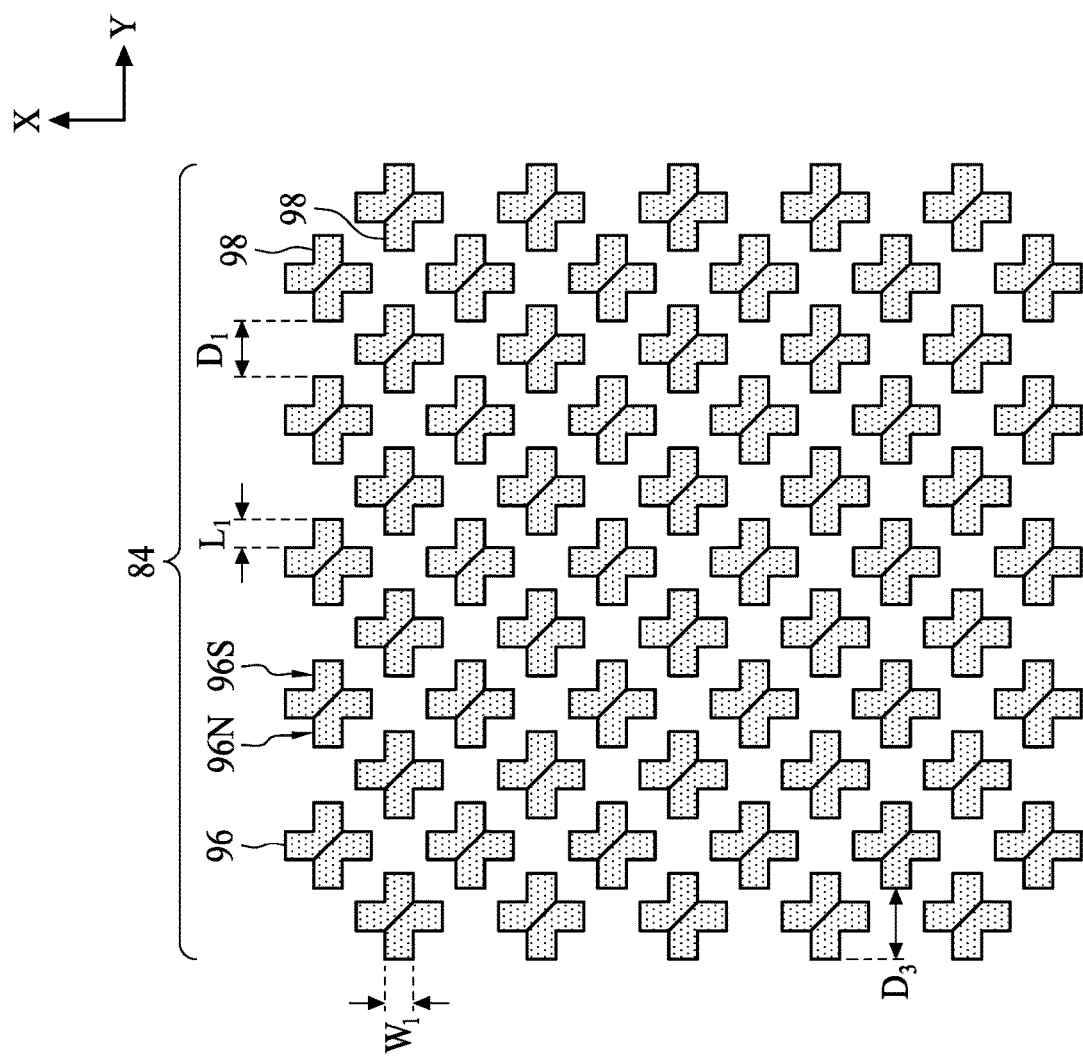

FIG. 20 is a top-down view of an alignment mark 84, in accordance with some other embodiments. Similar to the previous embodiments, the alignment mark 84 includes a plurality of magnetic features 96, which have a predetermined shape and are arranged in a predetermined pattern. In this embodiment, the magnetic features 96 are magnetic crosses. Each magnetic cross includes two magnetic bars that are perpendicular to one another. Utilizing magnetic crosses instead of magnetic bars allows the magnetic features 96 to have equally strong magnetic forces along both the X-direction and the Y-direction.

In this embodiment where the magnetic features 96 are magnetic crosses, each magnetic cross includes four arms 98 that protrude from a central portion. A first pair of adjacent arms 98 forms the north pole 96N of a magnetic cross. A second pair of adjacent arms 98 forms the south pole 96S of a magnetic cross. In some embodiments, the length $L_1$ of each arm 98 is in the range of 0.1 µm to 10 µm, and the width $W_1$ of each arm 98 is in the range of 0.01 µm to 5 µm.

The magnetic crosses are arranged in a grid that includes rows of the magnetic crosses. The magnetic crosses have a high density in each grid. In some embodiments, each alignment mark 84 includes from 1 to 500 magnetic crosses. In some embodiments, the alignment mark 84 (e.g., the magnetic features 96) has a total length along the first direction (e.g., the Y-direction) of about 50 µm (such as in the range of 10 µm to 100 µm), and has a total width along the second direction (e.g., the X-direction) of about 50 µm (such as in the range of 10 µm to 100 µm).

The magnetic crosses in a row are separated by a distance $D_1$ along the first direction (e.g., the Y-direction). In some embodiments, the distance $D_1$ is in the range of 0.1 µm to 10 µm. The arms 98 of adjacent rows of magnetic crosses may overlap with one another along the longitudinal axes of those arms 98. Within the grid, alternating rows of the magnetic crosses are offset from one another along their lengthwise direction (e.g., the Y-direction) by a distance $D_3$, and every other row of the magnetic crosses is aligned along their lengthwise direction (e.g., the Y-direction). In some embodiments, the distance $D_3$ is in the range of 0.1 µm to 10 µm. Offsetting alternating rows of the magnetic crosses can improve the accuracy of an alignment process utilizing the alignment mark 84.

Figure 21:
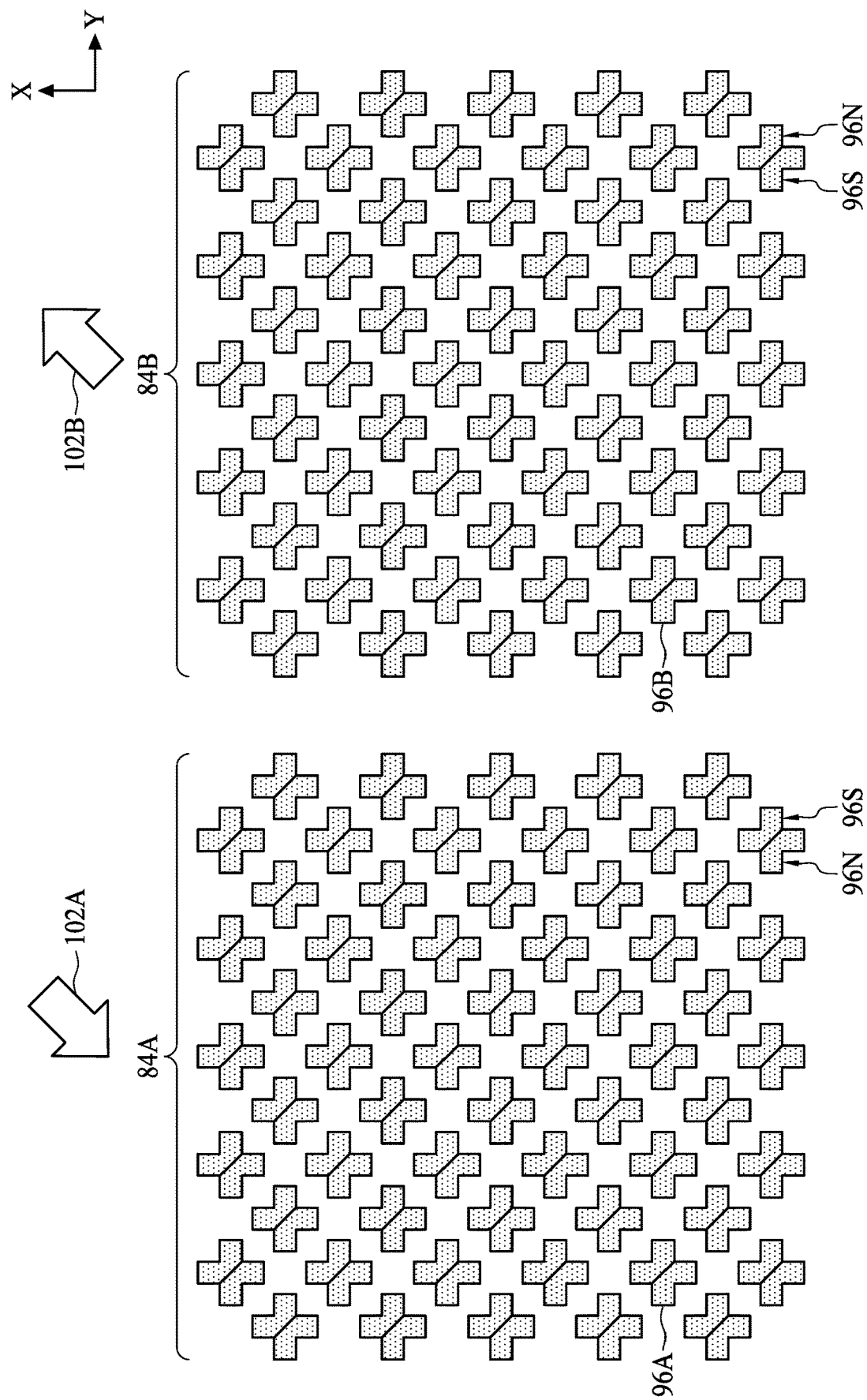
FIG. 21 is a view of an intermediate step during a process for forming alignment marks for wafers, in accordance with some other embodiments.

FIG. 21 is a view of an intermediate step during a process for forming alignment marks for wafers, in accordance with some other embodiments. As previously noted, different wafers may be formed with alignment marks that include magnetic features having opposite magnetic polarity. FIG. 21 illustrates the alignment marks 84 of FIG. 20 during the magnetization process for the alignment marks 84 (previously described for FIGS. 4A-4B). A first magnetic field 102A is utilized to magnetize the first magnetic features 96A of an first alignment mark 84A for a first wafer. A second magnetic field 102B is utilized to magnetize the second magnetic features 96B of a second alignment mark 84B for a second wafer. The first magnetic field 102A has an opposite magnetic polarity from the second magnetic field 102B. When the magnetic features 96A, 96B are magnetic crosses the first magnetic field 102A forms a first non-zero angle with each of the arms of the first magnetic features 96A, and the second magnetic field 102B forms a second non-zero angle with each of the arms of the second magnetic features 96B. The non-zero angles are between 0 degrees and 90 degrees. In some embodiments, the non-zero angles are 45 degree angles.

In an embodiment, a method includes: receiving a first wafer and a second wafer, the first wafer including a first alignment mark, the first alignment mark including a first grid of first magnetic features, the second wafer including a second alignment mark, the second alignment mark including a second grid of second magnetic features; aligning the first alignment mark with the second alignment mark in an optical alignment process; after the optical alignment process, aligning the first alignment mark with the second alignment mark in a magnetic alignment process, north poles of the first magnetic features being aligned with south poles of the second magnetic features, south poles of the first magnetic features being aligned with north poles of the second magnetic features; and forming bonds between the first wafer and the second wafer. In some embodiments of the method, each of the first magnetic features and the second magnetic features are magnetic bars. In some embodiments of the method, each of the first magnetic features and the second magnetic features are magnetic crosses. In some embodiments of the method, alternating rows of the first magnetic features within the first grid are offset. In some embodiments of the method, every other rows of the first magnetic features are aligned. In some embodiments of the method, the first wafer further includes a first dielectric layer, the first alignment mark is formed in the first dielectric layer, the second wafer further includes a second dielectric layer, the second alignment mark is formed in the second dielectric layer, and forming bonds between the first wafer and the second wafer includes: forming dielectric-to-dielectric bonds between the first dielectric layer and the second dielectric layer; and forming metal-to-metal bonds between the first alignment mark and the second alignment mark.

In an embodiment, a method includes: applying a first magnetic field to a first wafer to magnetize first alignment marks of the first wafer; applying a second magnetic field to a second wafer to magnetize second alignment marks of the second wafer, the first magnetic field anti-parallel to the second magnetic field, the first magnetic field and the second magnetic field having opposite polarity; moving the first wafer towards the second wafer along a first direction until the first alignment marks and the second alignment marks exert a horizontal force and vertical force on the first wafer and the second wafer, the vertical force being along the first direction, the horizontal force being along a second direction, the second direction perpendicular to the first direction, the horizontal force greater than the vertical force; and forming bonds between the first wafer and the second wafer. In some embodiments of the method, the first alignment marks each include first magnetic bars and the second alignment marks each include second magnetic bars. In some embodiments of the method, the first magnetic field is parallel to first longitudinal axes of the first magnetic bars, and the second magnetic field is parallel to second longitudinal axes of the second magnetic bars. In some embodiments of the method, the first alignment marks each include first magnetic crosses and the second alignment marks each include second magnetic crosses. In some embodiments of the method, the first magnetic field forms a non-zero angle with first arms of the first magnetic crosses, and the second magnetic field forms a non-zero angle with second arms of the second magnetic crosses. In some embodiments of the method, a ratio of the horizontal force to the vertical force is in a range of 1 to 2. In some embodiments of the method, the vertical force reduces warpage of the first wafer and the second wafer. In some embodiments of the method, moving the first wafer towards the second wafer begins moving the first alignment marks and the second alignment marks to aligned positions, the method further including: after moving the first wafer towards the second wafer, waiting until the first alignment marks and the second alignment marks finish moving to the aligned positions. In some embodiments of the method, waiting until the first alignment marks and the second alignment marks finish moving to the aligned positions including waiting for a duration in a range of 10 µs to 5000 µs. In some embodiments of the method, forming the bonds between the first wafer and the second wafer includes: contacting a first dielectric layer of the first wafer to a second dielectric layer of the second wafer; contacting the first alignment marks of the first wafer to the second alignment marks of the second wafer; and annealing the first wafer and the second wafer.

In an embodiment, a structure includes: a first device including a first dielectric layer and a first alignment mark in the first dielectric layer, the first alignment mark including first magnetic features; and a second device including a second dielectric layer and a second alignment mark in the second dielectric layer, the second alignment mark including second magnetic features, north poles of the first magnetic features being aligned with south poles of the second magnetic features, south poles of the first magnetic features being aligned with north poles of the second magnetic features, the first dielectric layer bonded to the second dielectric layer by dielectric-to-dielectric bonds, the first alignment mark bonded to the second alignment mark by metal-to-metal bonds. In some embodiments of the structure, each of the first magnetic features and the second magnetic features are magnetic bars. In some embodiments of the structure, each of the first magnetic features and the second magnetic features are magnetic crosses. In some embodiments of the structure, alternating rows of the first magnetic features are offset, and alternating rows of the second magnetic features are offset.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
receiving a first wafer and a second wafer, the first wafer comprising a first dielectric layer and a first alignment mark in the first dielectric layer, the first alignment mark comprising a first grid of first magnetic features, the second wafer comprising a second dielectric layer and a second alignment mark in the second dielectric layer, the second alignment mark comprising a second grid of second magnetic features;
aligning the first alignment mark with the second alignment mark in an optical alignment process;
after the optical alignment process, aligning the first alignment mark with the second alignment mark in a magnetic alignment process, north poles of the first magnetic features being aligned with south poles of the second magnetic features, south poles of the first magnetic features being aligned with north poles of the second magnetic features; and
forming bonds between the first wafer and the second wafer by:
forming dielectric-to-dielectric bonds between the first dielectric layer and the second dielectric layer; and
forming metal-to-metal bonds between the first alignment mark and the second alignment mark.

2. The method of claim 1, wherein each of the first magnetic features and the second magnetic features are magnetic bars.

3. The method of claim 1, wherein each of the first magnetic features and the second magnetic features are magnetic crosses.

4. The method of claim 1, wherein alternating rows of the first magnetic features within the first grid are offset.

5. The method of claim 4, wherein every other row of the first magnetic features is aligned.

6. The method of claim 1, wherein the optical alignment process comprises:
searching for the first alignment mark using a first camera that is disposed beneath the first wafer; and
searching for the second alignment mark using a second camera that is disposed beneath the second wafer.

7. A method comprising:
applying a first magnetic field to a first wafer to magnetize first alignment marks of the first wafer;
applying a second magnetic field to a second wafer to magnetize second alignment marks of the second wafer, the first magnetic field being anti-parallel to the second magnetic field, the first magnetic field and the second magnetic field having opposite polarity;
moving the first wafer towards the second wafer along a first direction until the first alignment marks and the second alignment marks exert a horizontal force and vertical force on the first wafer and the second wafer, the vertical force being along the first direction, the horizontal force being along a second direction, the second direction perpendicular to the first direction, the horizontal force greater than the vertical force; and forming bonds between the first wafer and the second wafer.

8. The method of claim 7, wherein the first alignment marks each comprise first magnetic bars and the second alignment marks each comprise second magnetic bars.

9. The method of claim 8, wherein the first magnetic field is parallel to first longitudinal axes of the first magnetic bars, and the second magnetic field is parallel to second longitudinal axes of the second magnetic bars.

10. The method of claim 7, wherein the first alignment marks each comprise first magnetic crosses and the second alignment marks each comprise second magnetic crosses.

11. The method of claim 10, wherein the first magnetic field forms a non-zero angle with first arms of the first magnetic crosses, and the second magnetic field forms a non-zero angle with second arms of the second magnetic crosses.

12. The method of claim 7, wherein a ratio of the horizontal force to the vertical force is in a range of 1 to 2.

13. The method of claim 7, wherein the vertical force reduces warpage of the first wafer and the second wafer.

14. The method of claim 7, wherein moving the first wafer towards the second wafer begins moving the first alignment marks and the second alignment marks to aligned positions, the method further comprising:

after moving the first wafer towards the second wafer, waiting until the first alignment marks and the second alignment marks finish moving to the aligned positions.

15. The method of claim 14, wherein waiting until the first alignment marks and the second alignment marks finish moving to the aligned positions comprising waiting for a duration in a range of 10 µs to 5000 µs.

16. The method of claim 7, wherein forming the bonds between the first wafer and the second wafer comprises:

contacting a first dielectric layer of the first wafer to a second dielectric layer of the second wafer;

contacting the first alignment marks of the first wafer to the second alignment marks of the second wafer; and annealing the first wafer and the second wafer.

17. A structure comprising:

a first device comprising a first dielectric layer and a first alignment mark in the first dielectric layer, the first alignment mark comprising first magnetic features; and a second device comprising a second dielectric layer and a second alignment mark in the second dielectric layer, the second alignment mark comprising second magnetic features, north poles of the first magnetic features being aligned with south poles of the second magnetic features, south poles of the first magnetic features being aligned with north poles of the second magnetic features, the first dielectric layer bonded to the second dielectric layer by dielectric-to-dielectric bonds, the first alignment mark bonded to the second alignment mark by metal-to-metal bonds.

18. The structure of claim 17, wherein each of the first magnetic features and the second magnetic features are magnetic bars.

19. The structure of claim 17, wherein each of the first magnetic features and the second magnetic features are magnetic crosses.

20. The structure of claim 17, wherein alternating rows of the first magnetic features are offset, and alternating rows of the second magnetic features are offset.

* * * * *